United States Patent
Yamasaki et al.

[11] Patent Number: 6,115,913
[45] Date of Patent: Sep. 12, 2000

[54] CONNECTING BOARD

[75] Inventors: Kozo Yamasaki, Gifu; Hajime Saiki, Aichi, both of Japan

[73] Assignee: NGK Spark Plug Co., Ltd., Nagoya, Japan

[21] Appl. No.: 09/313,070

[22] Filed: May 17, 1999

Related U.S. Application Data

[62] Division of application No. 08/837,869, Apr. 25, 1997.

[30] Foreign Application Priority Data

Apr. 26, 1996 [JP] Japan .................................. 8-130658
Mar. 13, 1997 [JP] Japan .................................. 9-82033

[51] Int. Cl.$^7$ ........................................................ H01R 9/00
[52] U.S. Cl. .................................. 29/843; 29/830; 29/852
[58] Field of Search ........................... 29/830, 831, 840, 29/827, 843, 852

[56] References Cited

U.S. PATENT DOCUMENTS

| | | | |
|---|---|---|---|
| 4,074,342 | 2/1978 | Honn et al. ................................. | 29/830 |
| 4,818,728 | 4/1989 | Rai et al. ................................... | 29/830 |
| 4,897,918 | 2/1990 | Osaki et al. ............................... | 29/830 |
| 4,914,814 | 4/1990 | Behun et al. .............................. | 29/843 |
| 5,056,216 | 10/1991 | Madou et al. ............................. | 29/830 |
| 5,071,359 | 12/1991 | Arnio et al. ............................... | 439/91 |
| 5,146,674 | 9/1992 | Frankeny et al. ......................... | 29/830 |
| 5,174,766 | 12/1992 | Yoshizawa et al. ....................... | 439/91 |
| 5,203,075 | 4/1993 | Angulas et al. ........................... | 29/830 |
| 5,261,155 | 11/1993 | Angulas .................................... | 29/830 |
| 5,317,801 | 6/1994 | Tanaka et al. ............................. | 29/830 |
| 5,340,947 | 8/1994 | Credle et al. ............................. | 174/262 |
| 5,388,327 | 2/1995 | Trabucco .................................. | 29/830 |
| 5,450,290 | 9/1995 | Boyko et al. .............................. | 29/830 |
| 5,456,004 | 10/1995 | Swamy ...................................... | 29/852 |
| 5,509,203 | 4/1996 | Yamashita ................................. | 29/879 |
| 5,512,786 | 4/1996 | Imamura et al. .......................... | 257/780 |
| 5,576,519 | 11/1996 | Swamy ...................................... | 174/265 |
| 5,601,678 | 2/1997 | Gerber et al. ............................. | 29/830 |
| 5,624,268 | 4/1997 | Maeda et al. ............................. | 439/66 |
| 5,656,798 | 8/1997 | Kubo et al. ............................... | 174/265 |
| 5,907,903 | 6/1999 | Ameen et al. ............................ | 29/830 |

FOREIGN PATENT DOCUMENTS

| | | |
|---|---|---|
| 60-123093 | 7/1985 | Japan . |
| 2-81447 | 3/1990 | Japan . |
| 5-50876 | 7/1993 | Japan . |
| 7-161866 | 6/1995 | Japan . |
| 7-273438 | 10/1995 | Japan . |

OTHER PUBLICATIONS

EPO Pat Abs of Japan Pub No. 6–268141 Publ, Sept. 1999.
EPO Pat Abs of Japan Pub No. 1–7541 Publ, Jan. 1989.
EPO Pat Abs of Japan Pub No. 3–192793 Publ, Aug. 1991.
EPO Pat Abs of Japan Pub No. 3–192794 Publ, Aug. 1991.
EPO Pat Abs of Japan Pub No. 3–192795 Publ, Aug. 1991.
EPO Pat Abs of japan Pub No. 5–8035935 Publ Mar. 1983.

*Primary Examiner*—Carl J. Arbes
*Attorney, Agent, or Firm*—Foley & Lardner

[57] ABSTRACT

A connecting board for electrically and mechanically connecting a base plate such as a circuit board having disposed thereon an IC chip to a mounting board such as a motherboard. The connecting board includes a substrate having a plurality of through holes, a plurality of soft metal bodies which are deformable with ease and which are mounted in the through holes, and a plurality of solder layers disposed on upper and lower end portions of the soft metal bodies. The soft metal bodies are mounted in the through holes by disposing soft metal pieces at end portions of the through holes, heating and melting and allowing them to be poured into the through holes. The solder layers are disposed on the upper and lower end portions of the soft metal bodies by using transfer jigs each having a plurality of holes filled with solder paste, placing the jigs on the upper and lower end portions of the soft metal bodies, melting the solder paste and allowing them to be transferred onto the soft metal bodies. An assembly of the base plate, connecting board and mounting board can be obtained by placing them one upon another and heating them.

10 Claims, 14 Drawing Sheets

CONNECTING BOARD

This application is a divisional of application Ser. No. 08/837,869, filed Apr. 25, 1997.

BACKGROUND OF THE INVENTION

1. Field of the Invention

The present invention relates to a connecting board interposed between a base plate having surface-bonding terminals, such as a base plate of a BGA (ball grid array) integrated circuit package, and a mounting board having similar terminals at corresponding positions, such as a motherboard, to provide electrical and mechanical connection therebetween. The present invention further relates to a method of making such a connecting board. The present invention still further relates to a method of making an assembly of a base plate, a connecting board and a mounting board. The present invention yet further relates to a method of making a subassembly of a base plate and a connecting board. The present invention yet further relates to a subassembly of a connecting board and a mounting board.

2. Description of the Related Art

As the integrated circuit technology has been developed recently, the number of the input/output terminals provided to IC (integrated circuit) chips has also increased, and this has increased the number of the input/output terminals formed on IC-mounted base plate on which the IC chips are mounted. However, it is not desired that the input/output terminals be formed on the peripheral portion of the base plate because the size of the base plate is enlarged as the number of the terminals increases whereby the cost of the IC-mounted base plates is elevated and their yield is lowered.

There has been widely used a so-called PGA (pin grid array) type base plate in which pins are arranged so as to form a grid pattern or checkered pattern on the main surface (main plane) of the IC-mounted base plate. However, the PGA type base plate has limitations when the number of the terminals is increased more and their size is decreased more.

The next method has been adopted to improve this situation. In place of the pins, pads (or lands) are arranged so as to form a grid pattern or checkered pattern on the surface of the base plate, and bumps, to which terminal members made of substantially ball-shaped high temperature solder or a metal such as copper or silver having good solder wettability is eutectically soldered, are formed on the pads. Other pads are formed on the related printed circuit board (PCB) such as a motherboard at the portions corresponding to the pads of the IC-mounted base plate, and eutectic solder paste is applied to the pads of the printed circuit board. Thereafter, both the base plate and the printed circuit board are placed one upon the other and heated to melt the solder paste. In this way, the base plate and the printed circuit board are bonded or connected together by solder through the terminal members. In general, a base plate which is provided with only pads arranged so as to form a grid pattern is called an LGA (land grid array) type base plate and a base plate which is provided with ball-shaped terminal members on the pads is called a BGA (ball grid array) type base plate.

When terminals such as pads or bumps are formed so as to constitute a grid pattern (including a checkered pattern) on the planar surface of an IC-mounted base plate and/or a printed circuit board and the IC-mounted base plate is bonded to the printed circuit board (hereinafter such bonding being referred to as "surface bonding"), difference in thermal expansion occurs between the IC-mounted base plate and the printed circuit board along the planar surface because the coefficients of thermal expansion of the IC-mounted base plate and the printed circuit board due to the difference in their materials. In other words, the IC-mounted base plate and the printed circuit board which are bonded together deform in the same directions along the planar surface but by a different amount from each other so that shearing stress is caused in the terminal members and the pads.

A maximum shearing stress is caused between the two terminals which are disposed remotest from each other when the magnitude of the shearing stress is taken into account between any two surface-bonded terminals. More specifically, in case the terminals are arranged so as to form a grid pattern and the outermost terminals form a square, the largest difference in thermal expansion occurs between the outermost terminals at each pair of diagonal corners of the square, and the largest shearing stress is caused on each pair of the outermost terminals. Upon bonding a base plate such as a LGA type base plate or a BGA type base plate to a printed circuit board in particular, the interval (pitch) between the terminals is relatively large, tending to make the distance between the most separated terminals large. Particularly, when an LGA type or BGA type base plate is made of ceramic, the base plate has a smaller coefficient of thermal expansion than a printed circuit board generally made of glass epoxy resin, and thus the base plate is applied with a larger shearing stress.

When such shearing stress is applied to the IC-mounted base plate in case the adhering strength (bonding strength) between the pads formed on the IC-mounted base plate and the solder is not so large, bonding between the base plate and the solder is sometimes broken, i.e., the solder as well as the terminal members are sometimes removed from the pads. Thus, it is desired to make the adhering strength large enough.

When, however, the adhering strength between the pads and the solder is increased, cracks extending substantially in parallel with the pads are produced in the solder in the vicinity of the related pads due to repeated thermal stress, and finally the solder is broken. Thus, it is impossible to attain a high bonding reliability. Since the solder in the vicinity of the pads is generally of an eutectic type, it is relatively hard and brittle and a secular change in the solder occurs easily due to heat and stress. Owing to this nature, cracks are produced in the solder when repeated stress is applied.

This problem is likely to arise in the joint between a LGA type base plate (or a BGA type base plate) made of ceramic which has a relatively low coefficient of thermal expansion and a printed circuit board made of resin such as glass epoxy resin which has a relatively high coefficient of thermal expansion. In most cases cracks are produced in eutectic solder portions in the vicinity of the pads formed on the ceramic base plate, because the base plate made of ceramic is hard and does not absorb stress whereas the printed circuit board made of resin and the pads made of copper or the like are relatively soft and absorb the stress.

Japanese patent application provisional publication No. 8-55930 discloses a package for housing semiconductors, having pads disposed on the bottom of the depression formed in the lower surface of an insulating substrate and bail-shaped terminal members having a predetermined dimensional relation to the pads and soldered to the pads. In this arrangement, the ball-shaped terminals are brazed to the pads accurately and securely.

In the package of this prior art, however, depressions must be formed in the insulating base plate (IC-mounted base plate) and pads must be provided to the bottom of the depression, leading to a complicated structure. This makes it difficult to fabricate the package and causes an increased manufacturing cost. It is also difficult to insert a blazing material in the depression and to solder the ball-shaped terminals to the pads.

After having purchased LGA type base plate on which IC chips are to be mounted, having mounted the IC chips on the base plate and having performed flip chip bonding, IC chip makers or manufacturers must bond the terminal members to the pads (lands) of the base plate by means of low temperature solder (for example, eutectic solder) which has a melting point lower than the solder (for example, high temperature solder) used for the flip chip bonding. In addition to the apparatus for flip-chip bonding the IC chips to the base plate, there are required apparatuses for fabricating a BGA type base plate from a LGA type base plate, i.e., apparatuses for applying solder paste (for example, eutectic solder paste) to the pads and an apparatus for mounting the terminal members on the pads.

On the other hand, the IC chip users are required to apply solder paste to the pads of a printed circuit board prior to placing the BGA type base plate on the printed circuit board and thereafter putting them in a reflow furnace to bond the BGA type base plate to the printed circuit board.

SUMMARY OF THE INVENTION

According to an aspect of the present invention, there is provided a connecting board to be interposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding and mounting pads on a second surface side of the connecting board. The connecting board comprises a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies.

The term "base plate" is herein used to indicate a wiring board or the like base plate on which an IC chip or the like electronic device is installed. The surface-bonding pad is a terminal formed on the base plate for electrical connection with the mounting board, i.e., pads for connection by means of surface bonding. The surface bonding is a bonding technology of using pads or bumps which are arranged on a chip, base plate or a motherboard so as to form a linear pattern or a grid pattern (including a checkered pattern) and bonding the base plate and the motherboard by way of the pads or bumps. A rectangular frame shape is an example of the linear pattern. A base plate having surface-bonding pads may be a LGA type base plate having pads (lands) arranged so as to form a grid pattern but may be a base plate having pads which are arranged so as to form another pattern.

The mounting board is a board for mounting thereon or attaching thereto the above described base plate, and a printed circuit board such as a motherboard is an example of the mounting board. Surface-bonding and mounting pads are formed on the mounting board for mounting the base plate on the mounting board by means of surface bonding. The surface-bonding and mounting pads are terminals for electrical connection with the base plate and for carrying out the connection by means of surface bonding. An example of the mounting board having the surface-bonding and mounting pads is a printed circuit board having pads which are arranged so as to form a grid pattern but it is not limited thereto. It may have a plurality of groups of surface-bonding and mounting pads which are arranged so as to correspond to a plurality of base plates which are to be bonded thereto.

The connecting board according to the present invention is disposed between the base plate and the mounting board and is bonded to them. The surface of the connecting board which is bonded to the base plate is called the "first surface" and the other surface which is bonded to the mounting board is called the "second surface" in order to be distinguished from each other for convenience.

Each through hole formed in the connecting board is generally a single hole but may consist of a bundle of small holes portions. In the latter case, soft metal portions inserted or mounted in the small hole portions are connected together to form a soft metal body.

The soft metal bodies are made of soft metal which is deformed to absorb stress produced between the base plate and the mounting board, between the base plate and the connecting board substrate and/or between the connecting board substrate and the mounting board due to difference in their coefficients of thermal expansion. The concrete material for the soft metal bodies is lead (Pb), tin (Sn), zinc (Zn), alloys containing some of these materials as major elements or components, Pb—Sn base high temperature solder (for example, an alloy consisting of 90% Pb and 10% Sn or an alloy consisting of 95% Pb and 5% Sn), white metal or the like. Since plastic deformation of a body made of lead, tin or the like material is attended with little stress but heat. Therefore, it is convenient to use these materials because they hardly are broken even if repeated stress is applied thereto. Other materials such as highly pure copper (Cu) or silver (Ag) can be used because they are soft.

Further, although the first surface side solder layers and the second surface side solder layers are only required so as to be made of solder which is comparatively lower in melting point than the above described soft metal bodies (hereinafter referred to as low melting point solder), it is desirable to provide a suitable difference between their melting points of the solder layer and the soft metal body. For example, in case 90%Pb-10%Sn alloy (melting point is 301° C.) is used for the high temperature solder, it will do to use 36%Pb-64%Sn eutectic solder (melting point is 183° C.) or the like Pb—Sn alloy such as an alloy of the composition consisting of around 20 to 50% Pb and around 80 to 50% Sn. Further, it will do to add to the above described solder a suitable amount of additional components such as In, Ag, Bi, Sb and so on.

Further, it will do to use the same material for the first surface side solder layer and the second surface side solder layer but otherwise use the different melting point materials properly for the layers. That is, it will do to use relatively higher melting point solder for the first surface side solder layer and relatively lower melting point solder for the second surface side solder.

The invention according to this aspect relates to a connecting board which is bonded or connected to a base plate on the first surface side and to a mounting board on the second surface side.

With this structure, soft metal bodies extending through the connecting board substrate are deformed (for example, plastically) to absorb the stress produced between the base plate and the mounting board, between the base plate and connecting board substrate or between the connecting board substrate and the mounting board due to the difference in the coefficients of thermal expansion of these materials. Therefore, the soft metal body is not broken. Further, the surface-bonding pads on the base plate and/or the surface-bonding and mounting pads on the mounting board (both pads being hereinafter simply referred to as the "pads"), or the solder or portions of the soft metal bodies which are disposed in the vicinity of the pads are not damaged or broken due to the stress. Further, since the stress is exerted from the soft metal body on the connecting board substrate perpendicularly to the circumferential surfaces of the through holes of the connecting board substrate, the connecting board substrate itself is hardly broken.

As the soft metal bodies are provided with protruded portions on at least one of the first surface side and the second surface side, the soft metal bodies can absorb, at the protruded portions, much stress which is produced between the base plate or the mounting board and the connecting board. The protruded portions can be deformed without being restricted by the through holes in the connecting board. Thus, the protruded portions are deformed more easily so as to absorb more stress. Since parts of the soft metal bodies which are inserted or mounted in the through holes in the connecting board form the protruded portions, the stress applied to the portions of the soft metal body which intersect the first surface and/or the second surface of the soft metal bodies (i.e., the roots of the protrusions) and the vicinity thereof is reduced by the deformation of the soft metal body whereby no cracks are produced in the protruded portions.

Further, since each soft metal body has the first surface side solder and the second surface side solder, the base plate (e.g., LGA type base plate) having a plurality of surface-bonding pads, the connecting board and the mounting board (e.g., motherboard) having a plurality of surface-bonding and mounting pads can be connected at one time or simultaneously by interposing the connecting board between the base plate and the mounting board and melting the solder layers. That is, an assembly of a base plate, connecting board and mounting board can be manufactured with ease and at low cost, while making it possible to dispense with the process of attaching terminals to the base plate and the process of applying solder paste to the mounting board.

Further, by attaching a connecting board to, for example, a LGA type base plate, it becomes possible to provide terminals of the kind of BGA type base plate to the LGA type base plate. That is, an equipment or apparatuses for printing of paste and installation of terminals can be dispensed with.

Further, for connection of the connecting board and the mounting board, it will suffice to melt the solder layers of the connecting board and connect them with the surface-bonding and mounting pads, so it can be dispensed with to apply paste onto the surface-bonding pads as conventional.

According to a further aspect of the present invention, each of the soft metal bodies has a surface area S1 on the first surface side and a surface area S2 on the second surface side. The surface areas S1 and S2 are different from each other, and an amount V1 of solder for each of the first surface side solder layers and an amount V2 of solder for each of the second surface side solder layers are set so that a larger amount of solder is applied to a larger surface area side.

Accordingly, if a sign of inequality is used to represent the relation of the first surface side and second surface side surface areas S1 and S2 of the soft metal body to the first surface side and second surface side solder amounts V1 and V2, the relation is expressed by:

in case S1>S2, V1>V2, and in case S1<S2, V1<V2.

In this connection, the term "first surface side surface area S1" is used to indicate a surface area possessed by a portion of the soft metal body protruding to the first surface side of the connecting board substrate, and similarly the term "second surface side surface area S2" is used to indicate a surface area possessed by a portion of the soft metal body protruding to the second surface side of the connecting board substrate.

Further, the term "amount V1 of solder" is used to indicate the volume occupied by the first surface side solder disposed on the first surface side of the soft metal body, and the term "amount V2 of solder" is used to indicate a volume occupied by the second surface side solder layer disposed on the second surface side of the soft metal body.

When the surface area is large, a solder layer disposed on that area is expanded over a relatively large area and becomes thinner as compared with a solder layer of the same amount of solder disposed on a relatively small surface area, thus causing the amount of solder contributing to bonding in the bonding to the pads (surface-bonding pads and surface-bonding and mounting pads) to be liable to become insufficient. Such an insufficiency of the amount of solder is liable to cause non-conduction and an insufficient bonding strength.

On the contrary, when the surface area is small, a solder layer disposed on that area is expanded over a relatively small area and becomes thicker as compared with a solder layer of the same amount disposed on a relatively large surface area, thus causing the amount of solder contributing to bonding in the bonding to the pads (surface-bonding pads and surface-bonding and mounting pads) to be liable to become too much. Such an excess of the amount of solder is liable to cause a short circuit between the adjacent terminals (pads) and an insufficiency of the bonding strength.

Since according to an aspect of the present invention a larger amount of solder is applied to a protruded portion of a larger height and a smaller amount of solder is applied to a protruded portion of a smaller height, suitable amounts (V1 and V2) of solder are used for bonding of the first protruded portion and the surface-bonding pad and for bonding of the second protruded portion and the surface-bonding and mounting pad, so a bonding defect and an insufficient bonding strength due to an insufficient amount of solder and an excess amount of solder is hardly caused and therefore highly reliable bonding can be attained.

According to a further aspect of the present invention, there is provided a connecting board to be disposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding and mounting pads on a second surface side of the connecting board. The connecting board comprises a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, and a plurality of first surface side solder layers, each of which is disposed on a surface portion of each of the soft metal bodies, which is located on the first surface side, the first surface side solder layers having a melting point lower than that of the soft metal bodies.

By this, the soft metal bodies mounted on the connecting board substrate absorbs, through deformation thereof, the stress caused between the base plate and the mounting board, between the base plate and the connecting board or between the connecting board and the mounting board due to the difference in thermal expansion therebetween. Accordingly, it never occurs breakage of the soft metal bodies, and further it never occurs breakage of the base plate surface-bonding pads of themselves, the mounting board surface-bonding and mounting pads of themselves or the solder and soft metal body around the pads.

Further, the soft metal body has a protruded portion on at least one of the first surface side and the second surface side, so the soft metal body can absorb at the protruded portion thereof much more stress caused between the base plate or the mounting board and the connecting board. This is because the protruded portion is deformable without any restriction by the through holes and it can effect a more amount of deformation and deform with ease to relieve the stress. Further, the protruded portion is formed from part of the soft metal body fitted or mounted in the through hole, the stress caused at or adjacent a portion crossing the first and second surfaces of the connecting board substrate (i.e., the root of the protruded portion) can be relieved through deformation of the soft metal body, so cracks or the like damage is not caused.

Further, since each soft metal body has the first surface side solder layer, the soft metal bodies of the connecting board and the surface-bonding pads of the base plate (e.g., LGA type base plate) can be connected at one time by placing the base plate and the connecting board one upon the other in such a manner that the surface-bonding pads and the corresponding first surface side solder layers are brought into contact with each other and melting the first surface side solder layers. That is, for such connection, it will suffice only to place the connecting board upon, for example, the pads (lands) of the LGA type base plate and heat them, so it becomes possible to provide the LGA type base plate with terminals like those of BGA type base plate with ease and without carrying out a process of applying paste to the pads of the LGA type base plate or placing ball-shaped terminals upon the pads as conventional. Accordingly, an equipment for printing of paste and disposition of terminal members can be dispensed with. Further, by making the connecting board connected on the second surface side to the mounting board, the base plate can be connected to the mounting board.

According to a further aspect of the present invention, there is provided a connecting board to be disposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding and mounting pads on a second surface side of the connecting board. The connecting board comprises a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, and a plurality of second surface side solder layers, each of which is disposed on a surface portion of each of the soft metal bodies, which is located on the second surface side, the second surface side solder layers having a melting point lower than that of the soft metal bodies.

By this, the soft metal bodies mounted on the connecting board substrate absorbs, through deformation thereof, the stress caused between the base plate and the mounting board, between the base plate and the connecting board or between the connecting board and the mounting board due to the difference of thermal expansion therebetween. Accordingly, it never occurs breakage of the soft metal bodies, and further it never occurs breakage of the base plate surface-bonding pads of themselves, the mounting board surface-bonding and mounting pads of themselves or the solder and soft metal body around the pads.

Further, the soft metal body has a protruded portion on at least one of the first surface side and the second surface side, so the soft metal body can absorb at the protruded portion thereof much more stress caused between the base plate or the mounting board and the connecting board. This is because the protruded portion is deformable without any restriction by the through holes and it can effect the more amount of deformation and deform with ease to relieve the stress. Further, the protruded portion is formed from part of the soft metal body fitted or mounted in the through hole, the stress caused at or adjacent a portion crossing the first and second surfaces of the connecting board substrate (i.e., the root of the protruded portion) can be relieved through deformation of the soft metal body, so a crack or the like damage is not caused.

Further, since the soft metal body has the second surface side solder layer, the connecting board and the mounting board having the surface-bonding and mounting pads (e.g., printed circuit board) can be connected at one time or at a stroke by placing them one upon the other in such a manner that the surface-bonding and mounting pads are brought into contact with the second surface side solder layers and melting the second surface side solder layers. That is, only by placing, for example, a printed circuit board and a connecting board one upon the other and without going through the process of applying solder paste on the pads of the printed circuit board as is conventional, it becomes possible to provide terminals on the pads of the printed circuit board. Accordingly, an equipment or apparatuses for printing of paste can be dispensed with. Further, through connection with base plate on the first surface side of the connecting board, the connecting board can be connected with the base plate and the mounting board.

According to a further aspect of the present invention, higher one of the first protruded portion and the second protruded portion is shaped like post or pillar and its height is larger than its maximum diameter. In case the protruded portion is nearly spherical or semi-spherical, increasing the height of the protruded portion for making larger the distance between the connecting board and the base plate or the mounting board is inevitably accompanied by increase in the maximum diameter of the protruded portion, so there are caused restrictions by the distance (pitch) of the adjacent soft metal bodies. With the structure according to this aspect, there are not caused such restrictions, and the distance between the connecting board and the base plate or the mounting board can be made larger on the higher protruded portion side. Furthermore, the protruded portion can be made relatively smaller in diameter and is defromable easier, so it can absorb much more stress.

According to a further aspect of the present invention, the substrate of the connecting board is made of ceramic. By being made of ceramic in this manner, the connecting board substrate can be higher in the strength and further in the resistance to heat, so it is high in strength and does not cause any deformation or the like even if it is subjected to repeated heating for rework.

In the meantime, the ceramic material can be, other than alumina, mullite, aluminum nitride, glass ceramic or the like, and is selected according to the circumstances, i.e., in consideration of ease of manufacture, the heat conductivity, the coefficient of thermal expansion, the materials of the base plate and the mounting board to be connected, or the like.

According to a further aspect of the present invention, each of the through hole has on an inner circumferential surface thereof a metal layer, the metal layer and each of the soft metal bodies being welded together.

By welding the soft metal body to the metal layer on the inner peripheral surface of the through hole, the soft metal bodies can be formed integral with the connecting board substrate by way of the metal layers. Accordingly, it never occurs that the soft metal bodies mounted in the through holes drop off from the through holes or are displaced axially thereof.

The material and the forming method of the metal layer formed on the inner circumferential surface of the through hole can be selected according to the circumstances, i.e., in consideration of the material of the connecting board substrate, the size of the through hole, the material of the soft metal body to which the metal layer is welded.

Particularly, in case the connecting board substrate is made of ceramic, the metal layer can be formed in the following manner. After through holes are formed in a green ceramic plate, metal paste is applied to the inner circumferential surfaces of the through holes and then is sintered together with the green ceramic plate. Alternately, after the ceramic plate has been sintered, the metal paste is applied to the inner circumferential surfaces of the through holes and then sintered. The metal used in the metal paste can be W, Mb, Mo—Mn, Ag, Ag—Pd, Cu or the like. In order to improve the welding property and to prevent oxidation and the like, Ni, Au or the like can be plated on the metal layer.

The metal layer may be formed by vapor deposition or spattering. Further, Cu-plating, Ni-plating, Au-plating or the like can be formed on the deposited or spattered metal layer. The metal layer may be directly deposited on the inner peripheral surface of the through holes by means of electroless Cu-plating or Ni-plating. Au-plating can be made on the deposited metal layer.

The connecting board substrate may not be formed with a metal layer in order to reduce the cost. As the soft metal bodies are not welded to the through holes in the connecting board substrate, it is preferred that the protruded portion have on at least one of the first surface side and the second surface side a larger diameter than that of the through holes in order to prevent the soft metal bodies from being removed from the the through holes.

According to a further aspect of the present invention, there is provided a method of making a connecting board to be disposed between a base plate having a plurality of surface-bonding pads and a mounting board having a plurality of surface-bonding and mounting pads at the corresponding positions to the surface-bonding and mounting pads of the base plate, for connection of the base plate and the mounting board through connection at the surface-bonding pads on a first surface side of the connecting board and at the surface-bonding and mounting pads on a second surface side of the connecting board, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising pouring molten soft metal from either of the first surface side or said second surface side into the through holes of the substrate and forming the soft metal bodies.

With this method, the soft metal bodies can be easily formed.

According to a further aspect of the present invention, the method further comprises prior to the pouring of the molten soft metal, disposing under the connecting board substrate a molten soft metal holding jig made of a material unwettable to molten soft metal and having depressions at the corresponding positions to the through holes, and after the pouring of the molten metal, holding the molted soft metal poured into the through holes at least within the depressions and the through holes and thereafter cooling and solidifying the molten soft metal.

According to these processes, a connecting board having soft metal bodies inserted in the through holes and formed with protruded portions can be fabricated easily. With these processes, the shape or the like of the protruded portions can be varied arbitrarily by changing the shape of the depressions and/or the volume of the poured or injected soft metal.

When, for example, the volume of the soft metal is more than the sum of the volume of the depressions of the jig and the volume of the through holes of the connecting board substrate, the molten metal is swelled upward from the upper ends of the through holes and is raised in a substantially semi-spherical shape or a substantially spherical shape by the surface tension and forms protruded portions maintaining the shape after solidification. The soft metal in each depression forms a protruded portion having a shape substantially complementary to the shape of the depression after solidification.

In case the volume of soft metal is substantially equal to the sum of the volume of the depressions and the volume of the through holes, the soft metal is filled in the through holes at the height substantially flush with the top of the through holes, and there is not formed any protruded portion protruding upward from the upper ends of the through holes but protruded portions are formed by the soft metal in the depressions.

When the volume of the soft metal is less than the volume of the depressions and the volume of the through holes, the protruded portions with an outer surface complementary to the shape of the lateral surface of the depressions and with the lower end (i.e., the tip of the protruded portions) having a substantially semi-spherical shape are formed in the depressions if the soft metal becomes integral with the connecting board substrate, e.g., the soft metal is wettable to the metal layer on the inner circumferential surfaces of the through holes.

The material of the jig for receiving molten soft metal can be suitably selected from the materials which are unwettable to the molten soft metal and has a good heat resistance. For example, the use of carbon or boron nitride facilitates the formation of the depressions. Further, ceramic such as alumina, mullite, silicon nitride or the like having high heat resistance may be used.

According to a further aspect of the present invention, the method further comprises, prior to the injection of the molten soft metal, disposing a soft metal piece at an end of each of the through holes on the first surface side or the second surface side, and heating the soft metal piece to melt and allowing molten soft metal to flow into each of the through hole for thereby carrying out the pouring or injection of the molten metal.

With this method, it is unnecessary to handle molten metal but it is only required to heat and melt the soft metal after it has been loaded on the required ends of the through holes. Since the soft metal molten by heating can be injected into the through holes simultaneously, the connecting board substrate can be formed easily.

The volume of the soft metal to be injected is constant since the volume of the metal pieces having a predetermined shape is constant. Thus, the size of the soft metal bodies can be made constant. This makes the height and the size of the protruded portions constant, making it possible to obtain a connecting board which has an excellent bonding property in the bonding to the base plate or the mounting board.

In this method, it is only required that the soft metal has a constant shape and a constant volume. Its shape may be spherical, cubic or in any other suitable shape. Since the metal pieces are to be melted, it does not matter how they are shaped before being melted.

The metal pieces made of soft metal are only required to have a constant shape and a constant volume.

According to a further aspect of the present invention, the soft metal piece is spherical.

By this aspect, since the metal pieces are spherical and their diameter is made constant, their volume can preferably be made constant. The spherical metal pieces are available at ease and can be put on the ends of the through holes without considering the loading direction of the metal pieces. After a plurality of spherical metal pieces (soft metal balls) have been put on the connecting board substrate at random, the substrate is swung in a suitable way, for example, by inclining it. Then, the spherical metal pieces are fitted in the through holes of the connecting board substrate and become immovable, and the spherical metal pieces which are not fitted in the through holes are removed easily, leading to easy loading of the spherical metal pieces.

According to a further aspect of the present invention, there is provided a method of making a connecting board to be disposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding pads on a second surface side of the connecting board, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising the steps of filling solder paste having a melting point lower than the soft metal bodies into paste filling holes of a transfer plate having the paste filling holes at the corresponding positions to the soft metal bodies, placing the transfer plate on the connecting board on at least one of the first surface side and the second surface side while aligning the paste filling holes with the soft metal bodies, and melting the solder paste at the temperature lower than the melting point of the soft metal bodies and forming at least one of the first surface side solder layer and the second surface side solder layer on a surface portion of each of the soft metal bodies, which is located on at least one of the first surface side and the second surface side.

With this method, the transfer plate is used, and solder paste is once filled in the paste filling holes of the transfer plate. The transfer plate is placed on the connecting board on at least one of the first surface side and the second surface side while aligning the past filling holes with the soft metal bodies. Then, the solder paste is melted at the temperature lower than the melting point of the soft metal bodies to form the solder layers on the soft metal bodies on at least one of the first surface side and the second surface side at one time.

Generally, there is a difficulty in applying paste to a protruded portion or a depressed portion assuredly and uniformly (in a manner to be equal or constant in volume). Accordingly, by once filling the solder paste filling holes of the transfer plate with solder paste and then melting the solder paste to transfer the molten metal paste to the soft metal bodies, the metal layers can be formed on the surfaces of the soft metal bodies at one time and with ease. When this is the case, the filling amount of paste can be controlled depending upon the thickness of the transfer plate and the size (diameter) of the paste filling holes, so the solder layers of a desired amount of solder can be formed with ease. Accordingly, the height of the solder layers can be made uniform or constant, and a good bonding ability in the bonding of the connecting board to the base plate and the mounting board can be obtained.

Further, in the above method, it is only required to place the transfer plate filled with solder paste upon the connecting board and heat it, so the transfer plate and the connecting board can be handed separately prior to the transferring of paste and therefore the handling thereof is easy.

In the meantime, it will do to form the transfer plate from a material which unwettable to solder and has a good heat resistance, for example, from metal such as stainless steel, carbon, boron nitride or ceramic such as alumina.

Further, the paste filling holes can be through holes or depressions (blind holes). In case the paste filling holes are through holes, the transfer plate can be produced with ease, for example, by punching or etching. On the other hand, in case of the depressions, the paste can be held in place easily and assuredly. Further, by setting the depth of the depressions suitably, the top of the solder layers can be flattened, and a good bonding or connecting ability of the connecting board with the base plate or the like can be obtained.

In the meantime, as the method of forming the solder layers, it can otherwise be employed a method of dipping a work in a solder bath of molten solder having a melting point lower than that of the soft metal bodies.

According to a further aspect of the present invention, there is provided a method of making a connecting board to be disposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding and mounting pads on a second surface side of the connecting board, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising the steps of placing on the connecting board a solder piece position control plate made of a material which is unwettable to solder and having penetrated guide holes at the corresponding positions to the soft metal bodies, while aligning the guide holes with the soft metal bodies located on at least one of the first surface side and the second surface side, disposing a solder piece in each of the guide holes of the solder piece position control plate, and melting the solder piece at the temperature lower than the melting point of the soft metal bodies and forming at least one of the first surface side solder layer and the second surface side solder layer on a surface portion of each of the soft metal bodies, which is located on at least one of the first surface side and the second surface side.

Generally, there is a difficulty in forming solder layers of a uniform or constant amount in protruded or depressed portions assuredly. With this method, the solder layers can be formed at one time or at one stroke by disposing the solder pieces in the guide holes and thereafter melting the solder pieces. Furthermore, since the amount of solder can be controlled depending upon the size of the solder piece, solder layers of a desired amount of solder can be formed with ease. Accordingly, the height of the solder layers can be made uniform or constant and a good bonding ability of the connecting board to the base plate and the mounting board can be obtained.

In this connection, it is only required that the solder pieces of a predetermined shape are constant in shape and volume. Their shape may be spherical, cubic or in any other suitable shape. Since the solder pieces are to be melted, it does not matter how they are shaped before being melted.

However, it is preferred to use a spherical solder piece. This is because by using spherical solder pieces of a constant diameter through control of their diameter their volume can be uniform or constant. Further, in this instance, in case spherical solder pieces are disposed or loaded in guide holes there is not any necessity of disposing them in a particular posture or state, so their loading can be attained with ease.

Further, after a plurality of spherical solder pieces are scattered on the connecting board substrate, the substrate is swung in a suitable way, for example, by inclining it. Then, the spherical solder pieces are fitted in the through holes of the connecting board substrate and become immovable, and the spherical solder pieces which are not fitted in the through holes are removed easily, leading to easy loading of the spherical solder pieces.

In the meantime, the solder piece position control plate can be formed from a material which is unwettable to solder and has a good resistance to heat, for example, metal such as stainless steel, carbon or ceramic such as boron nitride and alumina.

According to a further aspect of the present invention, there is provided a method of making an assembly consisting of a base plate, a connecting board and a mounting board, the base plate having a plurality of surface-bonding pads, the mounting board having a plurality of surface-bonding and mounting pads at the corresponding positions to the surface-bonding pads of the base plate, the connecting board being disposed between the base plate and the mounting board to connect them through connection at the surface-bonding pads of the base plate and at the surface-bonding and mounting pads of the mounting board, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising the steps of placing the base plate, the connecting board and the mounting board one upon another, and heating the base plate, the connecting board and the mounting board at a temperature lower than a melting point of the soft metal bodies to melt the first surface side solder layers and the second surface side solder layers and connecting the surface-bonding pads of the base plate with the corresponding first surface side solder layers of the connecting board while connecting the second surface side solder layers of the connecting board with the corresponding surface-bonding and mounting pads of the mounting board.

With this method, by placing the base plate, the connecting board and the mounting board one upon another and heating them to melt the first surface side solder layers and the second surface side solder layers, the surface-bonding pads of the base plate are connected to the corresponding first surface side solder layers of the connecting board and the second surface side solder layers of the connecting board are connected to the corresponding surface-bonding and mounting pads of the mounting board, at one time or at one stroke.

Accordingly, by disposing the connecting board between the base plate and the mounting board and heating them, they can be joined together at one time without the necessity of applying solder paste onto the pads of the base plate and the mounting board as is conventional or disposing ball-shaped terminals thereon one by one. Thus, it is unnecessary for, for example, an IC chip maker to have an equipment or apparatuses for forming a BGA type base plate from a LGA type base plate, and a user can dispense with an equipment or apparatuses for applying paste to a printed circuit board or omit the process therefor.

According to a further aspect of the present invention, there is provided a method of making a subassembly of a base plate and a connecting board, the base plate having a plurality of surface-bonding pads, the connecting board being connected to the base plate by way of the surface-bonding pads thereof, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising the steps of placing the base plate and the connecting board one upon the other, and heating the base plate and the connecting board at a temperature lower than a melting point of the soft metal bodies to melt the first surface side solder layers and connecting the surface-bonding pads of the base plate with the first surface side solder layers of the connecting board.

With this method, by placing the base plate and the connecting board one upon the other and heating them to melt the first surface side solder layer, the surface-bonding pads of the base plate and the corresponding first surface side solder layers of the connecting board are joined together at one time.

That is, by placing the base plate and the connecting board one upon the other and heating them, the base plate and the connecting board can be connected to each other at one time, without the necessity of applying solder paste onto the pads of the base plate or placing ball-shaped terminals thereon one by one as is conventional, so the base plate becomes connectable to the mounting board as in the case it is provided with terminals. Accordingly, it is unnecessary for, for example, IC chip makers or manufacturers to have an equipment or apparatuses for forming a BGA base plate from a LGA base plate.

In the meantime, in this method, there may be provided, after the step of melting the first surface side solder layer and connecting the base plate and the connecting board together, an additional step of forming on the surfaces of second surface side soft metal bodies second surface side solder layers having a melting point lower than that of the first surface side solder layer. By using a subassembly of a base plate formed with such second surface side solder layers and a connecting board, it becomes unnecessary to apply paste onto pads of a mounting board at the time of further connection with a mounting board and furthermore it becomes possible to melt the second surface side solder layers without causing the first surface side solder layers to melt.

According to a further aspect of the present invention, there is provided a method of making a subassembly of a connecting board and a mounting board, the mounting board having a plurality of surface-bonding and mounting pads, the connecting board being connected to the base plate by way of the pads thereof, the connecting board including a substrate in the form of flat plate, having the first surface and the second surface and a plurality of through holes extending between the first and second surfaces, a plurality of soft metal bodies mounted in the through holes, respectively, each of the soft metal bodies having at least one of a first protruded portion protruding from the first surface and a second protruded portion protruding from the second surface, a plurality of first surface side solder layers, each of which is disposed on a surface portion of each of the soft metal bodies, which is located on the first surface side, the first surface side solder layers having a melting point lower than that of the soft metal bodies, and a plurality of second surface side solder layers, each of which is disposed on a surface portion of each of the soft metal bodies, which is located on the second surface side, the second surface side solder layers having a melting point lower than that of the soft metal bodies, the method comprising the steps of placing the connecting board and the mounting board one upon the other, and heating the connecting board and the mounting board at a temperature lower than a melting point of the soft metal bodies to melt the second surface side solder layers and connecting the second surface side solder layers with the corresponding surface-bonding and mounting pads of the mounting board.

With this method, by placing the connecting board and the mounting board one upon the other and heating them to melt the second surface side solder layers, the second surface side solder layers and the corresponding surface-bonding and mounting pads of the mounting board can be connected or bonded together all at once or at one stroke.

Accordingly, by placing the connecting board and the mounting board one upon the other and heating them, the connecting board and the mounting board can be connected at one time without the necessity of applying solder paste onto the pads of the mounting board as is conventional. Accordingly, the user can dispense with an equipment for applying solder paste onto a printed circuit board and omit the process thereof.

In the meantime, in this method, there may be provided, after the step of melting the second surface side solder layer and connecting the connecting board and the mounting board together, an additional step of forming on the surfaces of the first surface side soft metal bodies first surface side solder layers having a melting point lower than that of the second surface side solder layer. By using a subassembly of a connecting board formed with such second surface side solder layers and a mounting board, it becomes unnecessary to apply paste onto pads of a base plate at the time of further connection with the base plate and furthermore it becomes possible to melt the first surface side solder layers without causing the second surface side solder layers to melt.

The above structures and methods can solve the above noted problems inherent in the prior art device and method.

It is accordingly an object of the present invention to provide a novel and improved connecting board which can make it easier the connection of a base plate having mounted thereon an IC chip or the like to a mounting board such as a printed circuit board and furthermore can attain such connection with an improved durability and reliability.

It is a further object of the present invention to provide a novel and improved method of making a connecting board of the foregoing character.

It is a still further object of the present invention to provide a method of making an assembly of a base plate, a connecting board of the foregoing character and a mounting board.

It is a yet further object of the present invention to provide a method of making a subassembly of a base plate and a connecting board of the foregoing character.

It is a yet further object of the present invention to provide a method of making a subassembly of a connecting board of the foregoing character and a mounting board.

BRIEF DESCRIPTION OF THE DRAWINGS

FIGS. 1A to 1C are enlarged fragmentary sectional views for illustrating processes of forming a connecting board substrate, wherein FIG. 1A shows the connecting board substrate in a state prior to firing, FIG. 1B shows the connecting board substrate in a state after firing, and FIG. 1C shows the connecting board substrate in a state of being plated;

FIGS. 2A and 2B are enlarged fragmentary sectional views for illustrating processes of mounting a soft metal body on the connecting board substrate of FIG. 1C, wherein FIG. 2A shows the soft metal body and the substrate in a state before mounting of the soft metal body on the substrate and FIG. 2B shows the soft metal body and the substrate in a state after mounting of the soft metal body on the substrate;

FIGS. 9A to 9C are enlarged fragmentary sectional views for illustrating processes of pouring soft metal into the connecting board substrate and allow it to penetrate therethrough, wherein FIG. 9A shows the state in which soft metal balls are mounted on the connecting board substrate, FIG. 9B shows the state in which the connecting board substrate having mounted thereon the soft metal balls is placed on a support, and FIG. 9C shows the state after pouring of soft metal;

FIGS. 12A and 12B are illustrations for explaining the amount of solder provided on the upper and lower surface sides of the soft metal body, respectively, wherein FIG. 12A shows a state before solder layers are provided to the first and second surface sides, and FIG. 12B shows a state in which solder layers which are equal in amount are provided to the both surfaces;

FIGS. 13A and 13B are sectional view for illustrating processes of connecting the connecting board to the base plate and the mounting board, wherein FIG. 13A shows a state in which the mounting board, connecting board and the base plate are placed one upon another in this order, and FIG. 13B shows a state in which the three boards are connected to each other;

FIGS. 14A and 14B are sectional views for illustrating the processes of connecting the connecting board to the base plate and the mounting board, respectively, wherein FIG. 14A shows connection of the base plate and the connecting board, and FIG. 14B shows connection of the connecting board and the mounting board;

FIGS. 15A and 15B are enlarged fragmentary sectional views for illustrating processes of pouring soft metal into the connecting board substrate and allow it to penetrate therethrough according to a further embodiment of the present invention, wherein FIG. 15A shows the state in which soft metal balls are mounted in a recess and at an upper end thereof of a jig, and FIG. 15B shows a state in which a connecting board substrate is set in place and pushed by a loading jig;

FIGS. 17A and 17B are enlarged fragmentary sectional views for illustrating processes of forming a solder layer on an upper side surface of a soft metal body, wherein FIG. 17A shows the state in which a low melting point solder ball is mounted on the upper surface side of the soft metal body, and FIG. 17B shows the state in which a solder layer is formed on the upper side surface of the soft metal body;

DESCRIPTION OF THE PREFERRED EMBODIMENTS

The present invention will now be described by way of the following preferred embodiments with reference to the following preferred embodiments with reference to the accompanying drawings.

(Fist Embodiment)

Referring first to FIGS. 1A to 5, a method of making a connecting board will now be described.

Figure 1A:
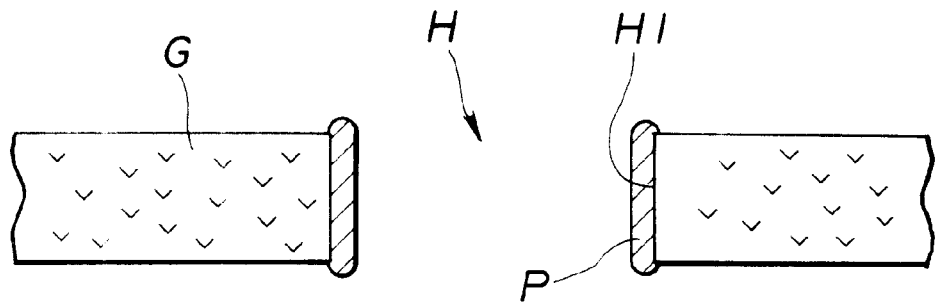

An alumina green sheet G having a plurality of through holes H (one of which is shown) is formed previously by the conventional ceramic green sheet forming technique. As shown in FIG. 1A, tungsten paste P is applied to the inner peripheral surface H1 in the sheet G.

The sheet G is sintered at the maximum temperature of substantially 1,550° C. in a reducing atmosphere to form a connecting board substrate 1 made of ceramic (hereinafter referred to only as the "substrate") and a base metal layer 2 containing tungsten as a major component. The substrate 1, which has been sintered, is in the form of flat plate which is 25 mm square and 0.3 mm thick. Each of the through holes H which extend through the substrate 1 between a first surface 1a and a second surface 1b of the substrate 1 is 0.8 m in diameter. Three hundred and sixty-one (361) through holes H are arranged at a pitch of 1.27 mm so as to form a grid pattern consisting of 19 vertical rows and 19 horizontal rows. The thickness of the base metal layer 2 is about 10 $\mu$m.

Figure 1B:
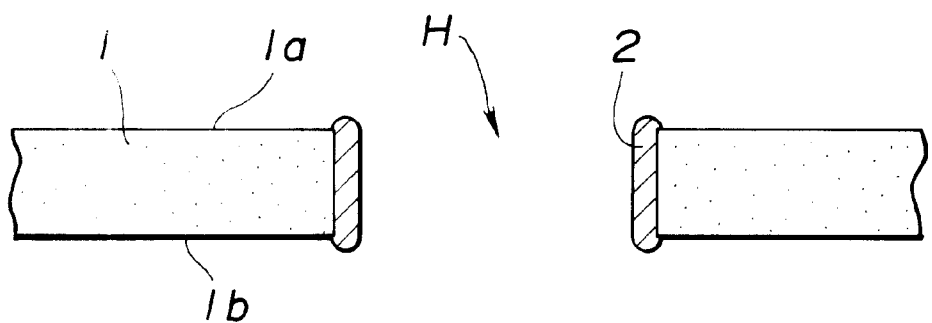
Figure 1C:
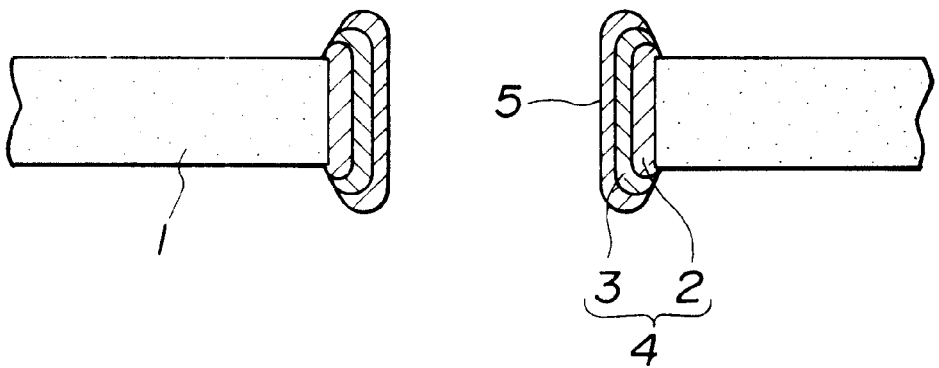

As shown in FIG. 1C, an electroless Ni—B plated layer 3 having a thickness of about 2 $\mu$m is formed on the base metal layer 2. Both layers 2 and 3 constitute a metal layer 4 to which soft metal is welded as will be described later. In order to prevent oxidation of the Ni—B plated layer 3, an electroless gold-plated layer 5 is formed thereon.

Figure 2A:
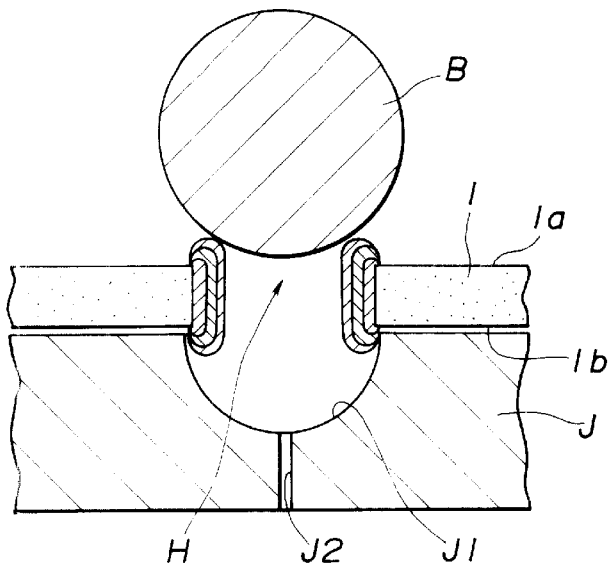
Figure 2B:
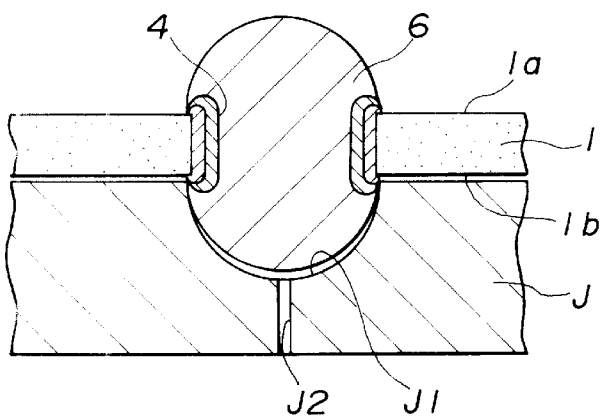

As shown in FIG. 2A, a jig J for receiving molten soft metal (hereinafter referred to as the "receiving jig") made of carbon has semi-spherical depressions J1 having a radius of 0.45 mm formed in its upper surface. The connecting board substrate 1 is placed on the receiving jig J with the second surface 1b of the substrate 1 facing the upper surface of the receiving jig J and with the through holes H aligned with the depressions J1. The receiving jig J made of carbon is unwettable to molten metal such as high temperature solder as will be described later. An air vent J2 having a small diameter (0.2 mm) extends through the receiving jig J from the bottom of each depression J1 to the lower surface of the receiving jig J. A high temperature solder ball B having a diameter of 0.9 mm is placed on the end of each through hole H on the first surface side (the upper end of the through hole in the figure).

The connecting board substrate 1 disposed on the receiving jig J and having the high temperature solder balls B placed thereon is put together with the jig J and the solder balls B in a reflow furnace of the maximum temperature of 360° C. and of the maximum temperature holding time of one minute in a nitrogen atmosphere. Then, the high temperature solder balls B are melted. The molten high temperature solder is caused to come down under the gravity and poured or injected into the through holes H to be welded onto the metal layer 4 (the Ni—B plated layer 3). The portion of molten high temperature solder on the second surface 1b side of the connecting board substrate 1 (i.e., lower portion) is swollen into a semi-shperical shape in the depressions J1 after the shape of the depressions J1 of the receiving Jig J, and the portion of the molten high temperature solder on the first surface 1a side of the connecting board substrate 1 (i.e., the upper portion) is swollen upward to such an extent corresponding to an amount by which the volume of the molten high temperature solder is larger than the volume of each through hole H. The upward bulged or swollen portion of the molten metal solder becomes substantially semi-spherical or spherical due to the surface tension of the molten solder. In this case, the shape is substantially semi-spherical.

The gold-plated layer 5 is diffused into the molten high temperature solder to disappear, so the high temperature solder is directly welded onto the Ni—B plated layer 3. Thus, the soft metal body 6 made of high temperature solder is fixed or adhered to the connecting board substrate 1. The air vent J2 in the receiving jig J relieves the air in the depressions J1. Since the receiving jig J is not wettable to the solder and the air vent J2 is small in size, the solder does not enter the air vent J2. With this structure, the soft metal bodies 6 made of high temperature solder are formed in the through holes H.

Figure 3:
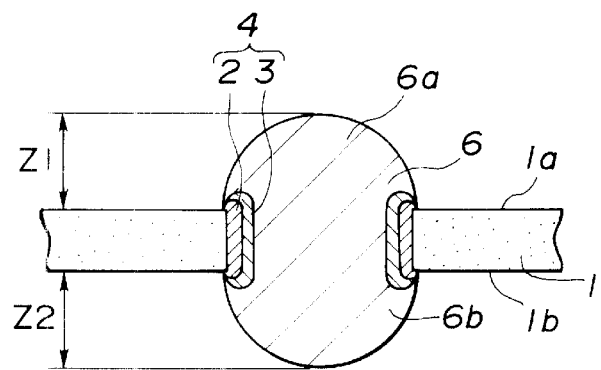
FIG. 3 is an enlarged fragmentary view of how the soft metal body protrudes from the connecting board substrate.
Figure 4A:
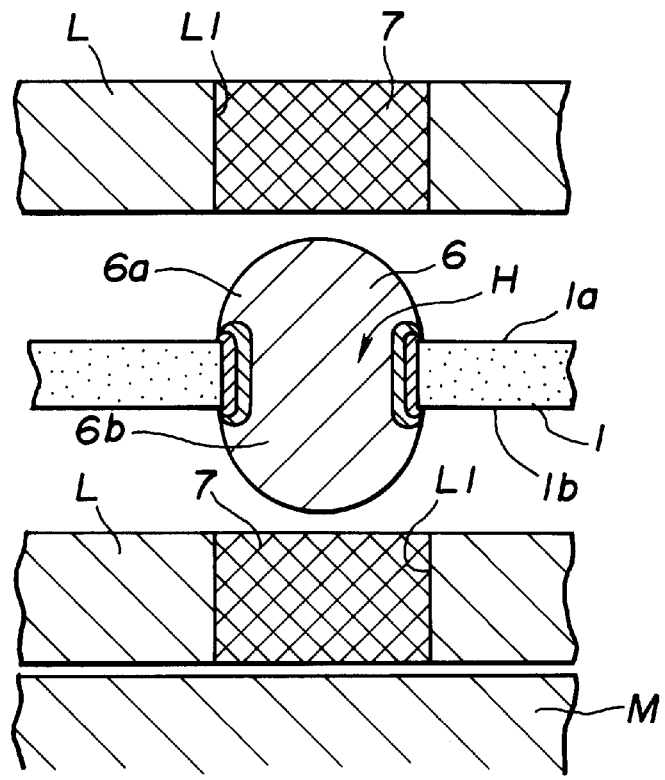
FIGS. 4A and 4B are enlarged fragmentary sectional views for illustrating processes of forming solder layers on portions of the soft metal body located on opposite sides (i.e., first and second sides) of the connecting board substrate.
Figure 4B:
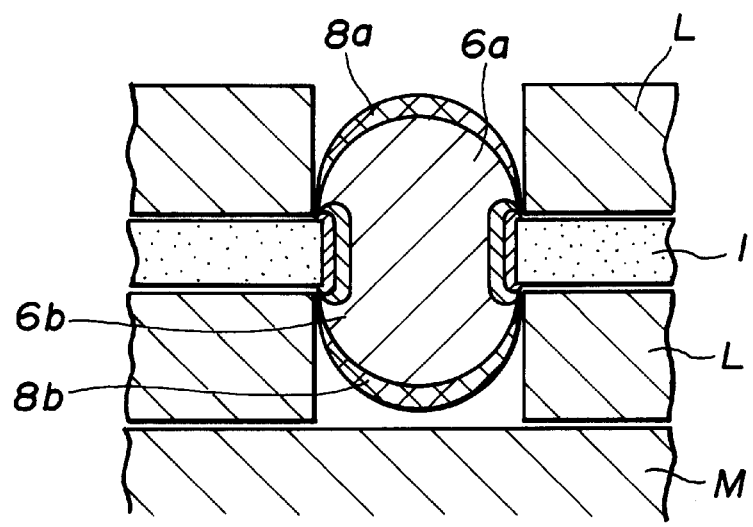

As shown in FIG. 3, each soft metal body 6 is inserted or mounted in the corresponding through hole H of the connecting board substrate 1 and fixed to the substrate 1 through the metal layer 4. The portion of the soft metal body 6 which is on the second surface 1b side (the lower surface side in the figure) of the connecting board substrate 1 forms a substantially semi-spherical protruded portion (swollen portion) 6b which has a complementary shape to the shape of the depression J1 of the receiving jig J and has a height (the second protruding height) Z2 of 0.2 m measured from the substrate 1 and a radius of 0.43 mm, and the portion of the soft metal body 6 which is on the first surface side (the upper surface in the figure) 1a forms a substantially semi-spherical protruded portion (swollen portion) 6a which is formed due to the surface tension and has a height (the first protruding height) Z1 of 0.2 mm and a radius of 0.43 mm. Not only the protruding heights Z2 of the protruded portions 6b but also the protruding heights Z1 of the protruded portions 6a are made constant because the high temperature solder balls B having the same volume are used. The protruding heights of the protruded portions 6a and 6b can be changed by varying the volume of the solder balls B through adjustment of its diameter.

In this element, the protruding height Z1 of the protruded portion 6a can be made smaller by reducing the diameter of the solder balls B, and the protruded height Z1 can be made larger by increasing the diameter of the solder balls B. Further, by pouring of a suitable amount of solder, the heights Z1 and Z2 of the protruded portions 6a and 6b can be made equal to each other.

Then, two carbon sheet jigs (i.e., transfer plate formed from a carbon sheet) L having through holes or filled-up holes L1 (0.86 mm in diameter and 0.17 mm long) corresponding in position to the through holes H of the connecting board substrate 1 are prepared, and the through holes L1 are filled up with solder paste (in this example, Pb—Sn eutectic solder paste) which is lower in melting point than the soft metal (in this embodiment, high temperature solder of 90%Pb-10%Sn) by squeezing. By this, the amount of paste 7 filling the through hole L1 can be regulated to a predetermined value with ease. One of the transfer plates L, the connecting board substrate 1 and the other of the transfer plates L are disposed and set in this order on a carbon support jig M in such a manner that the through holes L of each transfer plate L are aligned with the soft metal bodies 6 or the through holes H (refer to FIG. 4A).

Thereafter, the set of the transfer plates L, the connecting board substrate 1 and the support jig M is put into a reflow furnace of the maximum temperature of 220° C. and the maximum temperature holding time (i.e., the time for which a work is held at the maximum temperature within the furnace) of one minute to make the low melting point solder paste to melt in a nitrogen atmosphere. In the meantime, under such a temperature condition, the soft metal body 6 is not caused to melt. The melted masses of low melting point solder wet the upper and lower protruded portions 6a and 6b of the soft metal body 6 and extend thereover, and are formed into solder layers 8a and 8b, respectively. Since the amount of the paste 7 is regulated to a predetermined constant amount, the solder layers 8a and 8b are constant or uniform in the amount (i.e., volume), and therefore are equal in height at each protruded portions.

In the meantime, by making suitably smaller the thickness of the carbon jig (transfer plate) L in place of making smaller the thickness of the carbon jig (transfer plate) L, it becomes possible to prevent the solder layers 8a and 8b from being expanded sideways and becoming lower in height for the reason of the fact that the transfer plate L is not wetted by solder, thus making it possible to increase the height of the solder layer which is formed by the same amount of solder.

Figure 5:
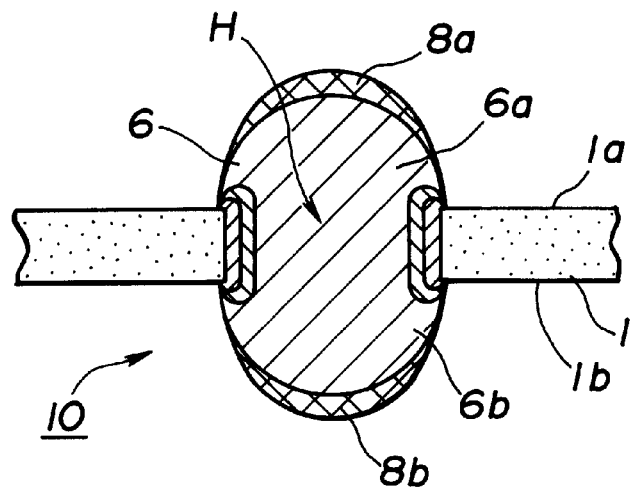
FIG. 5 is an enlarged fragmentary sectional view of a connecting board in a finished or completed state.

In this manner, a connecting board 10 shown in FIG. 5 is completed.

The connecting board 10 consists of a connecting board substrate 1 which is made of alumina ceramic and in the form of plate or sheet, and has a plurality of through holes H (though only one is shown in FIG. 5) extending between opposite first and second surfaces 1a and 2a thereof, a plurality of soft metal bodies 6 inserted into the respective through holes H to pass therethrough and each having protruded portions 6a and 6b protruding outward from the respective surfaces 1a and 1b, solder layers 8a each disposed on the protruded portion 6a on the first surface 1a side and having the melting point lower than that of the soft metal body 6, and solder layers 8b each disposed on the protruded portion 6b on the second surface 1b side and having the melting point lower than that of the soft metal body 6.

In this connection, the connecting board 10 has on the lower surface side in FIG. 5 and on the protruded portion 6b of the soft metal body 6 a solder layer 8b having a nearly semi-spherical outer shape and 0.45 mm high from the substrate, and similarly on the upper surface side and on the protruded portion 6a a solder layer 8a having a nearly semi-spherical outer shape and 0.25 mm high from the substrate 1 by the effect of the surface tension.

Then, the connecting board 10 completed in the above described manner is connected to a base plate and a mounting board in the following manner.

Figure 6A:
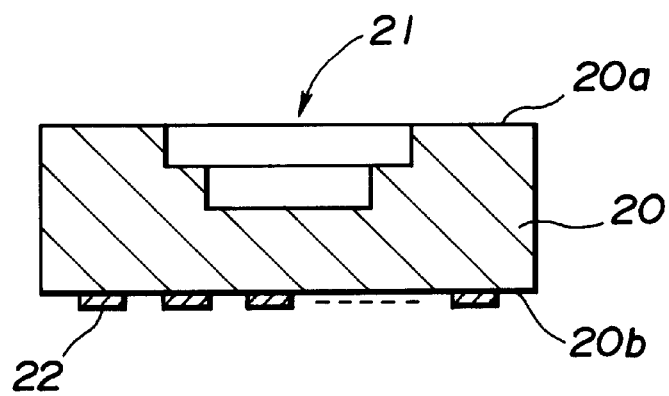
FIG. 6A is a sectional view of a base plate to be bonded or connected to a connecting board.

Firstly, a LGA (land grid array) type board 20 of 2.5 mm thick and 25 mm nearly square as shown in FIG. 6A is prepared as a board to which the connecting board 10 is to be bonded or connected. The LGA type board 20 is a circuit board made of alumina ceramic and has on the upper surface 20a side a cavity 21 in which an IC (integrated circuit) chip is to be disposed and on the lower surface 20b side a plurality of pads (surface-bonding pads) 22 which serve as external connection terminals. The pads 22 are arranged at a pitch of 1.27 mm in such a manner as to form a grid pattern consisting of nineteen vertical rows and nineteen horizontal rows and each having a tungsten base layer which is Ni—B-plated non-electrolytically and further gold-plated non-electrolytically by a small amount for prevention of oxidation. Further, the pads 22 are connected to bonding pads (not shown) for connection with an IC chip by way of an internal wiring (not shown).

Figure 6B:
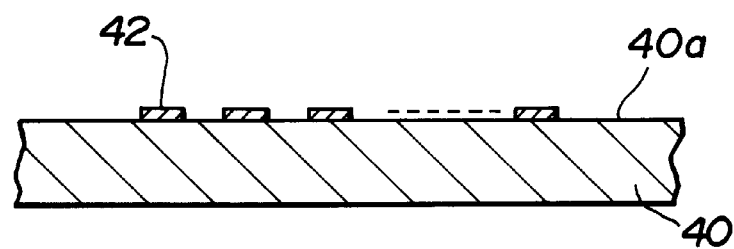
FIG. 6B is a sectional view of a printed circuit board to be bonded or connected to a connecting board.

A printed circuit board 40 as shown in FIG. 6B is prepared as a mounting board. The printed circuit board 40 is in the form of flat plate which is 30 mm square and 1.6 mm thick. The printed circuit board 40 is made of epoxy resin (Japanese Industrial Standard: FR-4). Pads (surface-bonding and mounting pads) 42 are formed on the main surface 40a of the board 40 at the positions corresponding to the soft metal bodies 6 of the connecting board substrate 1. The pads 42 are made of copper and have a thickness of 25 μm and a diameter of 0.72 mm and are arranged at a pitch of 1.27 mm so as to form a grid pattern consisting of 19 vertical rows and 19 horizontal rows.

Figure 7A:
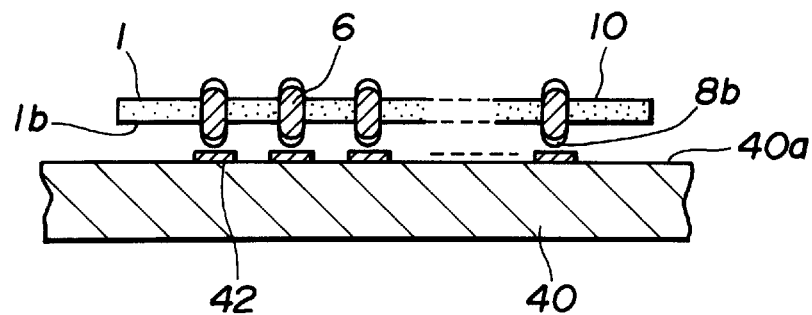
FIG. 7A is a sectional view for illustrating a process of connecting the connecting board to the printed circuit board of FIG. 6B.

As shown in FIG. 7A, the printed circuit board 40 is placed so that the main surface 40a having pads 42 is directed upward. Then, the connecting board 10 prepared in the above described manner is placed on the printed circuit board 40. In this instance, each pads are aligned with the solder layers 8b formed on the soft metal bodies 6 on the second surface side of the connecting board substrate 1.

Figure 7B:
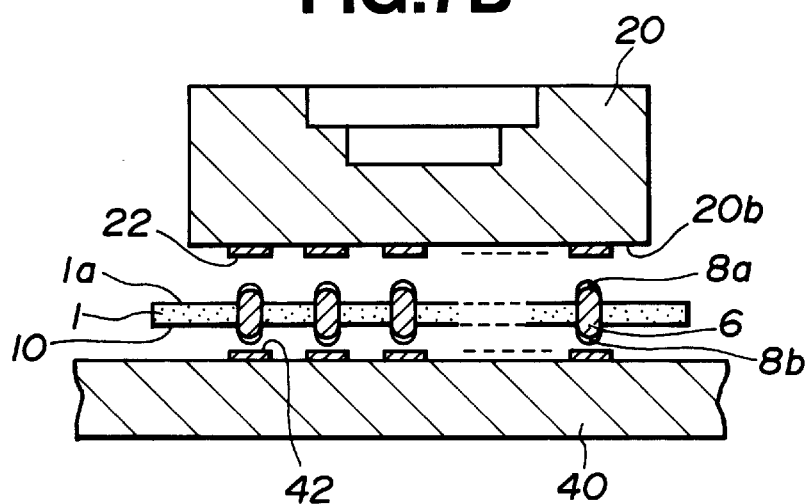
FIG. 7B is a sectional view for illustrating a process of further connecting the base plate of FIG. 6A to the connecting board in addition to the process of FIG. 7A.

Further, as shown in FIG. 7B, the base plate 20 is placed on the connecting board 10 in such a manner that the surface 20b having the pads 22 faces down. In this instance, the pads 22 and the solder layers 8a disposed on the soft metal bodies 6 and located on the first surface (upper surface in FIG. 7B) 1a of the substrate 1 are aligned with each other.

Then, the set of the base plate 20 and the connecting board 40 is put into a reflow furnace of the maximum temperature of 218° C. and adapted to hold a work above 200° C. for two minutes, to make the solder layers 8a and 8b made of low melting point solder to melt and thereby connect the pads 22 and 42 to the respective protruded portions 6a and 6b of the soft metal bodies 6 all together one at one time or stroke.

Figure 8:
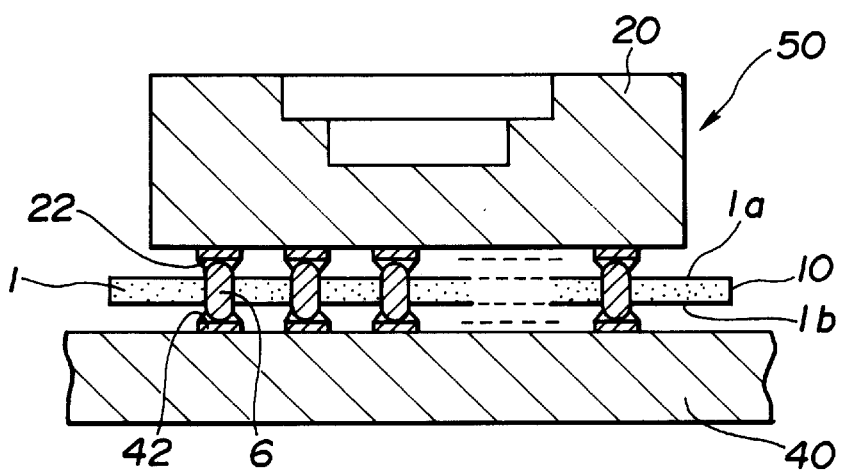
FIG. 8 is a sectional view of the base plate, connecting board and mounting board in a assembled or bonded state.

In the meantime, at this time the soft metal bodies 6 made of high temperature solder are not caused to melt. By this, as shown in FIG. 8, the connecting board 10 is connected to the LGA type base plate 20 and at the same time to the printed circuit board 40, so that three devices, i.e., the base plate, connecting board and mounting board which are joined together to complete an assembly 50. By so doing, the base plate 20 is connected to the mounting board 40 by way of the connecting board 10.

By this, the distance between the first surface 1a of the connecting board substrate 1 and the lower surface 20b of the LCA type base plate 20 was 0.44 mm and the distance between the second surface 1b of the connecting board substrate 1 and the upper surface 40a of the printed circuit board 40 was 0.24 mm. This is due to the fact that the heights Z1 and Z2 of the upper and lower protruded portions 6a and 6b differ from each other.

In the meantime, although flux can be used at the time of reflow for joining the above described three devices, they can be joined without using any flux when the pads 22 and 42 are gold-plated and prevented from oxidation.

Heretofore, it has been had to firstly apply low melting point solder paste to the pads 22 of the BGA type board, then dispose ball-shaped terminal members made of high temperature solder, etc. one by one on the pads 22, and thereafter form terminals by reflow for thereby making a BGA type base plate.

However, by doing as mentioned above, it becomes possible to connect the base plate 20 to the printed circuit board 40 with ease simply by placing the connecting board 10 and the base plate 20 in this order on the printed circuit board 40 and heating them, so a process of once forming a LGA type base plate into a BGA type base plate becomes unnecessary, and further a process of applying solder paste to a printed circuit board becomes unnecessary.

Further, as mentioned above, in case connection (i.e., soldering) is made without using any flux at the time of reflow, a washing or cleaning process which is necessitated in case solder paste is used, becomes unnecessary.

In the above-mentioned embodiment, the printed circuit board 40, the connecting board 10 and the LGA type base plate are placed one upon another in this order and reflow is performed so that the base plate 20 and the connecting board 10, and the connecting board 10 and the printed circuit board 40 are respectively joined (soldered) together at one time or simultaneously. However, they need not be bonded together at one time. For example, the connecting board 10 may be connected to the LGA type base plate 20 to form a base plate with a connecting board and thereafter they may be connected to the printed circuit board 40. Alternately, the connecting board 10 and the printed circuit board 40 are bonded together previously and thereafter they may be connected to the base plate 20. In any case, the use of the connecting board 10 according to the present invention makes it unnecessary to dispose the terminal members one by one on the pads and allows the base plate and the mounting board to be bonded together through the connecting board only by heating them (by making a reflow process on them) once or twice. Therefore, IC chip manufacturers and users can omit some troublesome steps and/or equipment.

When heating is carried out twice, it is preferred that the above described solder layers 8a and 8b may have different melting points.

In other words, in case the base plate 20 is bonded to the connecting board 10 previously and thereafter the printed circuit board 40 is bonded to them, the melting point of the solder layer 8a is made higher than that of the solder layer 8b. When the printed circuit board 40 with the connecting board 10 is to be bonded to the printed circuit board 40 by melting the solder layer 8b, the temperature at which the solder layer 8a is not caused to melt can be selected so that no displacement occurs between the base plate 20 and the connecting board 10.

In case, on the other hand, the printed circuit board 40 and the connecting board 10 are bonded together to form a subassembly and then the base plate 20 is bonded to the subassembly, the melting point of the solder layer 8b is made higher than that of the solder layer 8a. In order to bond the base plate 20 with the connecting board 10 to the printed circuit board 40 by melting the solder layer 8a, the temperature at which the solder layer 8b is not caused to melt can be selected. Thus, no displacement occurs between the connecting board 10 and the printed circuit board 40.

(Second Embodiment)

In the first embodiment, the soft metal body 6 is shown to have both protruded portions 6a and 6b which does not differ so much in the protruding height, i.e., the difference in the protruding height of the protruded portions 6a and 6b being relatively small. However, the protruded portions can be formed in such a way that the difference in the protruding height is large. In the second embodiment, there will be described a connecting board having protruded portions protruding largely on one surface side of the connecting board substrate.

Similarly to the case of the first embodiment described with reference to FIGS. 1A to 1C, the connecting board has a connecting board substrate 1 made of ceramic and a plurality of through holes H each formed with a metal layer 4 on the inner circumferential or peripheral surface thereof. Similarly to the case of the first embodiment, the connecting board substrate 1 is in the form of flat plate which is 25 mm square and 0.3 mm thick and formed therein through holes H of 0.8 mm in diameter. The through holes H are three hundred and sixty-one (361) in number and are arranged at a pitch of 1.27 mm so as to form a grid pattern consisting of 19 vertical rows and 19 horizontal rows.

Figure 9A:
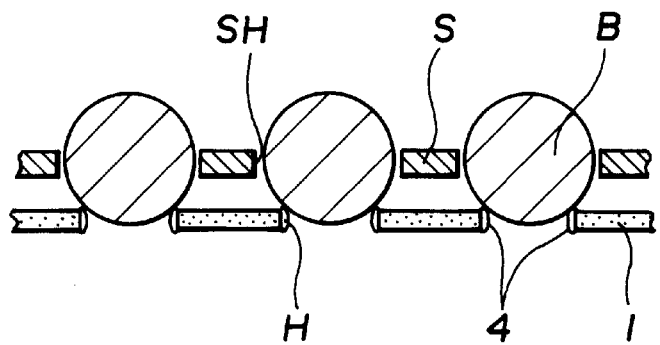

In the next step, high temperature solder balls B are placed on the upper ends of the through holes H of the connecting board substrate 1, as shown in FIG. 9A. This step can be done easily when it is performed in the following way. A ball control plate S formed with through holes SH having a diameter slightly larger than the diameter of the balls B at the positions corresponding to the through holes H is prepared and disposed above the connecting board substrate 1. Then, the height temperature solder balls B are scattered or placed at random on the ball control plate S, and the connecting board substrate 1 and the ball control plate S are held and swung. The balls B roll on the ball control plate S and fall in the through holes SH to become immovable. After the balls B fall in all through holes SH, the remaining balls B on the ball control plate S are removed. In this way, the balls B can engage the upper ends of all the through holes H, as shown in FIG. 9A. In the second embodiment, each high temperature solder ball B is made of 90% PB-10% Sn and 0.9 mm in diameter. The ball control plate S is 0.5 mm thick, its through holes are 1.0 m in diameter.

Figure 9B:
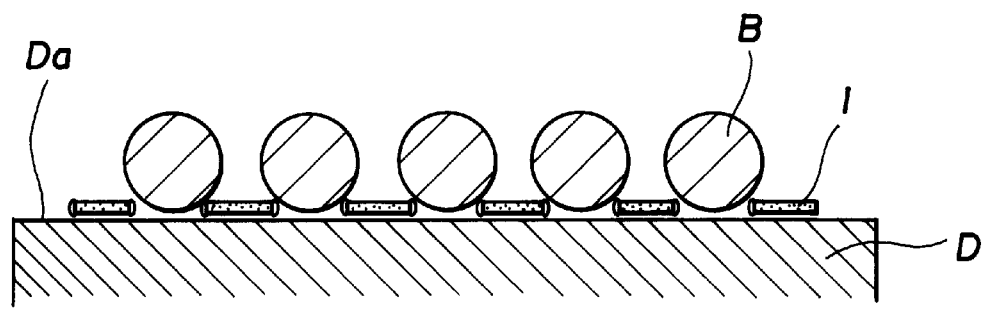

Thereafter, as shown in FIG. 9B, the ball control plate S is removed, and the connecting board substrate 1 on which the high temperature solder balls B are placed is mounted on a support D made of alumina ceramic having a good resistance to heat, unwettable to molten high temperature solder and having a flat upper surface Da. Alternately, the connecting board substrate 1 may be placed on the support D first, and then the balls B may be placed on the upper ends of the through holes H in the above-mentioned manner.

The connecting board substrate 1 and the balls B supported on the support D are placed in a reflow furnace and is heated at the maximum temperature of 360° C. for the maximum temperature holding time of one minute in a nitrogen atmosphere so that the balls B are melted. The molten high temperature solder spreads and is moved downward under the gravity. Then, it is poured or injected into the through holes H and welded onto the metal layers 4 (Ni—B plated layers 3). After cooled, the connecting board substrate 1 having soft metal bodies 206 (made of high temperature solder) inserted or mounted in the through holes H of the connecting board substrate 1 is produced.

Figure 9C:
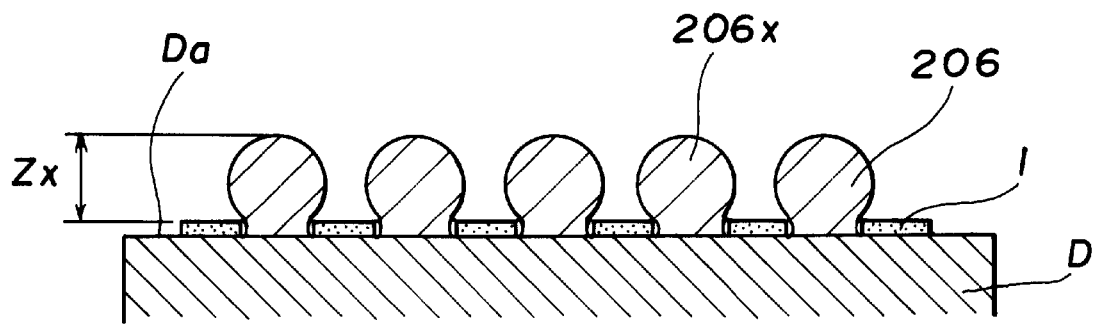

Since the support D is disposed under the connecting board substrate 1, the molten high temperature solder is made complementary to the flat upper surface Da of the support D. Thus, as shown in FIG. 9C, the portion of each soft metal body 206 on the lower surface side of the connecting board substrate 1 becomes substantially flush with the lower surface of the substrate 1 and does not protrude or protrude little therefrom. In an example of this embodiment, the protruding height Zy of this portion of each soft metal body 206 was 0.03 mm.

The portion of the molten metal high temperature solder which is on the upper surface side of the connecting board substrate 1 is swollen upward to such an extent corresponding to the excess amount by which the volume of the high temperature solder is larger than the volume of each through holes H and forms a protruded portion 206x. The swollen portion is formed under the surface tension and is made nearly spherical or semi-spherical according to the excess volume of the high temperature solder. In an example of this embodiment, the shape of the protruded portion 206x was a nearly three-quarter sphere having the maximum diameter of 0.9 mm and its protruding height Zx measured from the upper surface of the connecting board substrate 1 was 0.7 mm.

Similarly to the case of the first embodiment, the gold-plated layer 5 is melted and diffused into the molten high temperature solder. Thus, the soft metal bodies 206 made of high temperature solder is directly welded onto the Ni—B plated layers (metal layers 4) and fixed to the connecting board substrate 1. When there is a gap between the connecting board substrate 1 and the upper surface Da of the support D while the high temperature solder is being melted, the molten high temperature solder in the through holes sometimes spreads laterally through the gap to connect some of the soft metal bodies 206 to each other. In order to avoid this, it is better to put a load or weight on the connecting board substrate 1 or to press the substrate 1 toward the support D.

Figure 10:
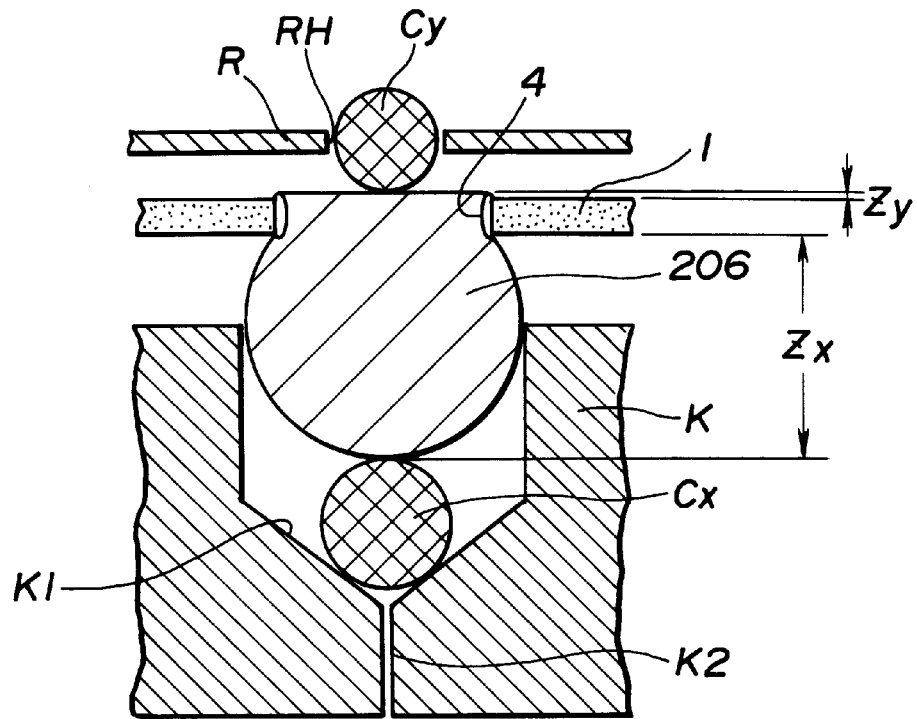
FIG. 10 is an enlarged fragmentary sectional view for illustrating a process of forming solder layers on the soft metal body on the upper and lower surface sides thereof, respectively.

Then, on the upper and lower portions of each soft metal body 206, low melting point solder layers are formed by using a jig J which is structured similarly to the melted soft metal receiving jig J as described with respect to the first embodiment. That is, as shown in FIG. 10, a solder mass holding jig K made of carbon which is a material having a good resistance to heat and not wettable to low melting point solder, has on the upper side a plurality of cavities or depressions K1 which are disposed at positions corresponding to the soft metal bodies 206 and each of which is 1.0 mm in diameter and 0.95 mm deep, and conical at a lower end or bottom. Further, the holding jig K has at the top (lowest portion in the figure) of the depression K1 an air vent K2 which is small in diameter (0.2 mm) and extending downward to penetrate the holding jig K.

Firstly, a low melting point solder (Pb—Sn eutectic solder) ball Cx of 0.6 mm in diameter is previously mounted in each depression K1.

Then, the connecting board substrate 1 is held in a reversed condition (i.e., a condition turned upside down) as compared with that shown in FIG. 9 and is placed on the holding jig K in such a manner that the lower surface of the connecting board substrate 1 is positioned opposite to the upper surface of the solder mass holding jig K and the protruded portion 206X of each soft metal body is inserted into the corresponding depression K1. In this instance, due to the provision of the low melting solder ball Cx within each depression K1, the lower surface of the base plate substrate 1 is held out of contact with the upper surface of the holding jig K, and the protruded portion 206X goes into the depression K1 until the ball Cx and the top of the protruded portion 206x are brought into contact with each other.

Thereafter, also on the soft metal bodies 206 of the connecting board substrate 1 there are disposed low melting point solder balls (Pb—Sn eutectic solder ball) Cy of 0.4 mm in diameter, respectively. In the meantime, although the solder balls Cy may be disposed one by one, their disposition can be done more easily by using a ball control plate R having through holes RH which are slightly larger in diameter than the solder balls Cy. That is, the ball control plate R is prepared and disposed above the connecting board substrate 1. Then, the low melting point solder balls Cy are scattered on the ball control plate R and then made to roll on the control plate R and fall into the through holes RH one after another to become immovable by swinging the connecting board 1 and the control plate R while holding them together. Then, by removing unnecessary solder balls Cy on the control plate R after the solder balls Cy are made to fall into all of the through holes RH, it is attained and completed to dispose the solder balls Cy on the upper surfaces of the respective soft metal bodies 206.

In this embodiment, the ball control plate R is 0.4 mm thick and the through hole RH is 0.6 mm in diameter. Further, it is convenient to use the ball control plate R also in the reflow process of making the low melting point solder balls Cy melt since it can prevent roll of the solder balls Cy, so it is desirable to use a material which is heat resistant and not wettable to low melting point solder, for making the control plate R, and in this embodiment sheet of stainless steel is used. Otherwise, it will do to use titanium or the like metal and alumina, silicon nitride or the like ceramic for making the control plate R. Still otherwise, it will do to employ such a technology of applying flux to the upper surface of the soft metal body 206 and fix the solder ball Cy thereto by the effect of the adherence of the flux.

Figure 11:
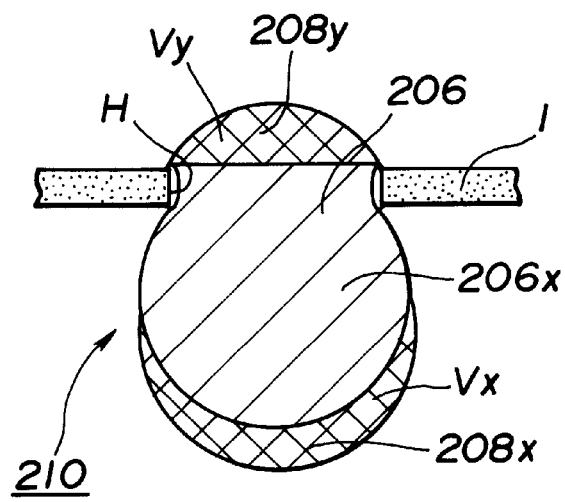
FIG. 11 is a fragmentary sectional view for illustrating a state in which solder layers are formed on the upper and lower surface sides of the soft metal body.

Thereafter, the connecting plate 1, the holding Jig K and the control plate R are put into the reflow furnace of the maximum temperature of 220° C. and of the maximum temperature holding time of 1 minute to melt the low melting point solder balls Cx and Cy in a nitrogen atmosphere. In the meantime, under such a temperature condition, the soft metal bodies 206 are not caused to melt. As shown in FIG. 11, the masses of molten low melting point solder wet the lower protruded portion 206 of the soft metal body 206 and the upper surface of the same while spreading thereover and are formed into the solder layers 208x and 208y, respectively. In the meantime, the solder layer 208x is formed due to the fact that a mass of molten low melting point solder is brought into contact with the protruded portion 206x to wet while spreading over it.

The solder layers 208x and 208y are of a fixed amount or volume and also equal in height since the low melting point solder balls Cx and Cy are regulated to a fixed amount. In this embodiment, the height from the lower face of the connecting board substrate 1 to the top (the lowest end in FIG. 11) of the solder layer 208x was 0.75 mm and the height from the upper surface of the connecting board substrate 1 to the top (the height end in FIG. 11) of the solder layer 208y was 0.1 mm.

In the meantime, the air vent K2 of the holding Jig K vents air which is confined in the depression K1 when the solder ball Cx is caused to melt.

In this manner, as shown in FIG. 11, a connecting board 210 consisting of a connecting board substrate 1 having a plurality of through holes H extending between the upper and lower surfaces thereof, a plurality of soft metal bodies 206 inserted into the through holes H and each protruding from the lower surface of the substrate 1 to have a protruded portion 206x, a plurality of solder layers 208x each formed on the soft metal body 206x on the upper surface side of the substrate 1 and having a melting point lower than that of the soft metal bodies 206, and a plurality of solder layers 208y formed on the soft metal bodies 206 and having a melting point lower than that of the solder layer 208x.

In the meantime, in this embodiment, the solder ball Cx and the solder ball Cy which are different in diameter, i.e., in volume, are used. The reason why will be described hereinafter.

Figure 12A:
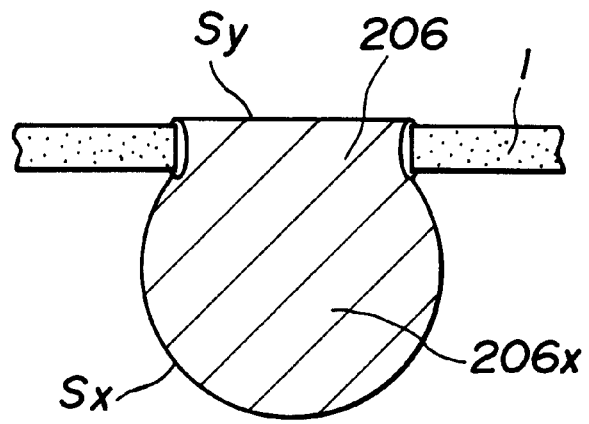

As shown in FIG. 12A, in the soft metal body 206, the surface area on the lower surface side of the substrate 1, i.e., the surface area Sx of the protruded portion 206x is larger than the surface area Sy on the upper surface side of the substrate 1.

Figure 12B:
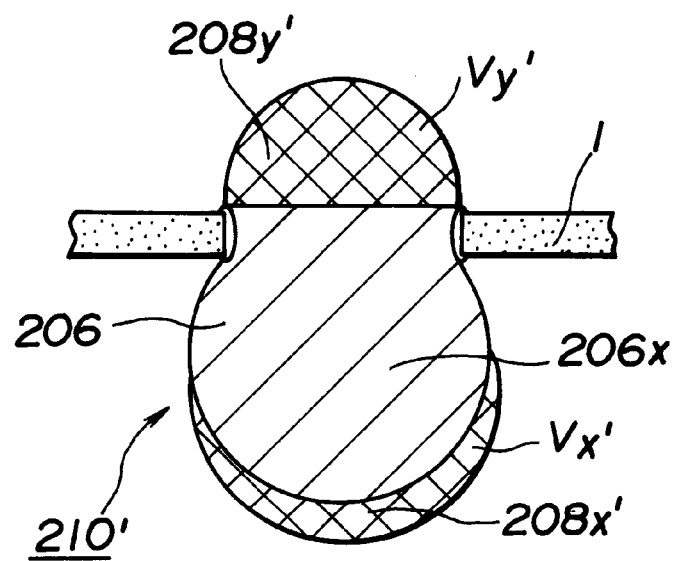

In such a case, if solder balls of the same volume (Vx'=Vy') and therefore of the same diameter are used to form the solder layers in the similar manner as described above, a thinner low melting point solder 208x' results as shown in FIG. 12B since the surface area Sx of the soft solder body 206 is large on the lower surface side of the substrate 1 and the low melting point solder is liable to spread over the surface of the solder body 206. On the other hand, the surface area Sy of the soft metal body 206 on the upper surface side of the substrate 1 is small and there is not any extra surface over which the low melting point solder spreads, resulting in that the solder layer 208y' becomes thicker.

In the meantime, when such a connecting board 210' is used to connect a LGA type base plate and a printed circuit board, the solder layer 208x' which is spread wider and thin cannot provide a sufficient amount of solder that contributes to connection with the pads of the base plate or printed circuit board, so there is a possibility of non-conduction and an insufficient connection strength. On the other hand, the thick solder layer 208y' provides a too much amount of solder that contributes to connection with the pads of the base plate or printed circuit board, so there is a possibility of decrease in the insulation distance between the adjacent pads and in the worst case, solder bridge of the adjacent pads being caused to develop a short circuit. Further, a too much amount of solder is liable to cause an insufficient joining strength.

Accordingly, in order to satisfy the above described two contradictory matters at the same time, a low melting point solder ball of a relative large volume (i.e., of a large diameter) is used on the protruded portion 206x side to increase the amount Vx of solder for solder layer 208x, whereas a low melting point solder ball of a relatively small volume (i.e., of a small diameter) is used on the smaller surface side, i.e., on the upper surface side having no protrusion, whereby it becomes possible to form solder layers 208x and 208y of suitable amounts on either side of the substrate 1.

Then, such a connecting board 210 is connected to a LGA base plate 220 and a printed circuit board 240 in the manner similar to that as described with respect to the first embodiment.

Firstly, the LGA type base plate 220 1.0 mm thick and 25 mm square is prepared as a base plate for connection to the connecting board 210. The LGA type base plate 220 is made of alumina ceramic and has on the upper surface 220a thereof a plurality of pads 221 for disposing thereon and connecting thereto an IC chip by a flip-chip bonding technology, and on the lower surface 220b a plurality of pads (i.e., surface-bonding pads) 222 which are provided to serve as external connection terminals. The pads 222 are 0.86 mm in diameter and are arranged at the positions corresponding to the soft metal bodies of the connecting board 210, i.e., arranged at a pitch of 1.27 mm so as to form a grid pattern consisting of nineteen vertical rows and nineteen horizontal rows, and the molybdenum layer that is a base layer is Ni—B-plated non-electrolytically and further gold-plated non-electrolytically in such a manner as to have a thin coating, for prevention of oxidation. Further, the pads 222 are connected to the flip-chip pads 221 by way of an internal wiring (not shown).

Figure 13A:
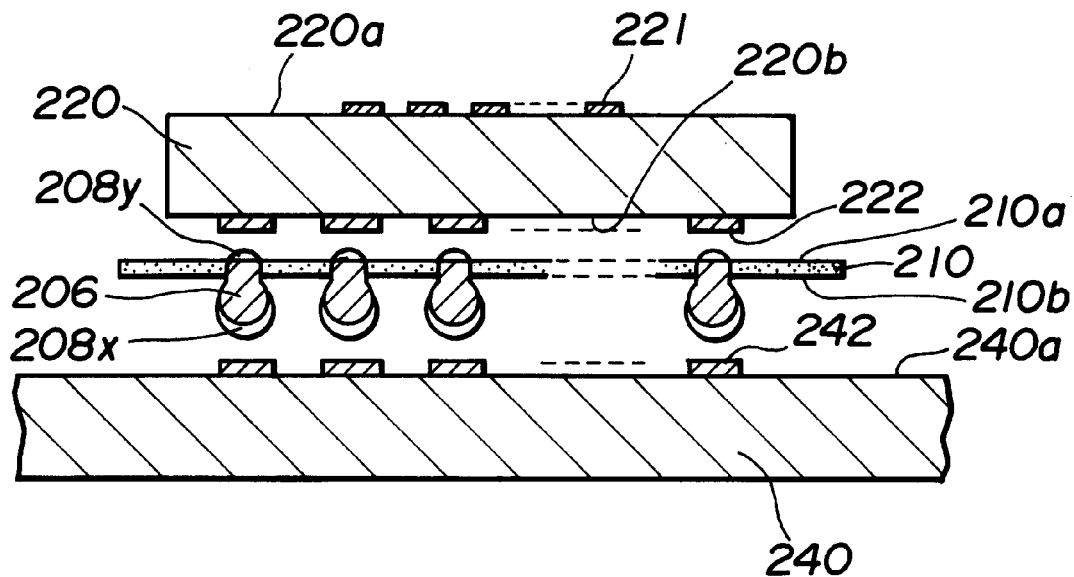

Further, the printed circuit board 240 as shown in the lower part of FIG. 13A is prepared to serve as a mounting board. The printed circuit board 240 is in the form of a rectangular plate 1.6 mm thick and 230 mm by 125 mm in size and is made of glass epoxy (FR-4 according to Japanese Industrial Standards) and has on the main or upper surface 240a thereof a plurality of pads 242 at locations corresponding to those of the soft metal bodies 206 of the connecting board 210. The pads 242 are made of copper and 0.72 mm in diameter and 25 μm thick and are arranged at a pitch of 1.27 mm so as to form a grid pattern consisting of nineteen vertical rows and nineteen horizontal rows, i.e., 361 pads in total. In the meantime, the printed circuit board 240 has two vertical rows and four horizontal rows of such a group of pads 242, i.e., eight groups of such pads 242 so as to be capable of connecting thereto eight of such base plates 220 at one time.

As shown in FIG. 13A, the printed circuit board 240 is disposed so that the mean surface 240a having the pads 242 faces up, and the connecting board 210 which is prepared in the above described manner is disposed on the printed circuit board 240. At this time, alignment of each pads 242 with the solder layers 208x which are formed on the soft metal bodies 206 and located on the lower surface side of the connecting board substrate 1, is performed.

Further, the base plate 220 is disposed on the connecting board 210 in such a manner that the surface 220b having the pads 222 faces down. At this time, alignment of the pads 222 with the solder layers 208y which are formed on the soft metal bodies 206 and located on the upper surface side of the connecting board 206, is performed.

Then, the base plate 220, the connecting board 210 and the printed circuit board 240 are put into a reflow furnace of the maximum temperature of 218° C. and adapted to heat a work at a temperature above 200° C. for two minutes, to melt the solder layers 208x and 208y of low melting point solder in a nitrogen atmosphere and connect the pads 222 and the pads 242 to each other at one time or stroke.

Figure 13B:
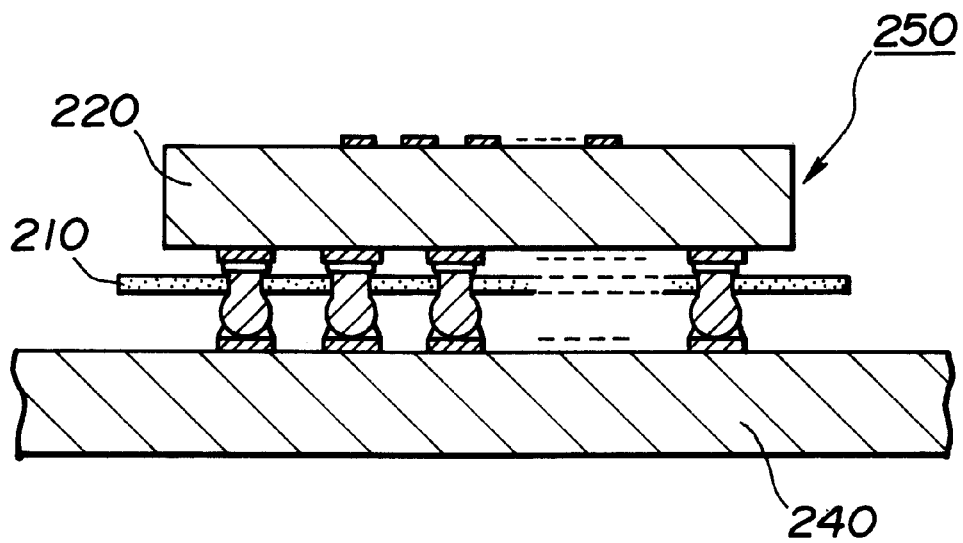

In the meantime, in this instance, the soft metal bodies 206 made of high temperature solder (high-melting solder) are not caused to melt. By this, as shown in FIG. 13B, the connecting board 210 is connected to the LGA type base plate 220 and at the same time to the printed circuit board 240, so that an assembly of three devices, i.e., a base plate, connecting board and printed circuit board which are connected to each other, is completed. By so doing, the base plate 220 is connected to the mounting board 240 by way of the connecting board 210.

By this, it could be produced such an assembly 250 in which the distance between the upper surface 210a (first surface) of the connecting board 210 and the lower surface (second surface) 220b of the LGA type base plate 220 was 0.05 mm and the distance between the lower surface 210b (second surface) of the connecting board 210 and the upper surface 240a of the printed circuit board 240 was 0.72 mm so the distance between the connecting board 210 and the mounting board 240 was larger than that between the base plate 220 and the connecting board 210 (by about fourteen times). This is because the soft metal body 206 protrudes little on the first surface side and has a protruded portion 206x on the second surface side.

Particularly, in this embodiment, the distance between the LGA base plate 220 made of alumina ceramic and the connecting board substrate 1 made of alumina ceramic can be made considerably smaller as compared with the distance between the connecting board substrate 1 and the printed circuit board 240 made of glass epoxy. By so doing, when the assembly is heated or cooled, there is scarcely caused any stress between the LGA type base plate 220 and the connecting board 210 (connecting board substrate 1) which are made of the same material due to the difference of thermal expansion. On the other hand, there is caused a difference of thermal expansion and therefore a stress between the connecting board 210 and the printed circuit board 240.

Accordingly, there never occurs breakage of the LGA type base plate 220. On the other hand, the stress that is a part of the thermal stress between the connecting board 210 and the printed circuit board 240 and is applied to the connecting board side, is applied to the protruded portion (second protruded portion) 206x of the soft metal body 206 at a location thereof adjacent the second surface and in the direction parallel to the second surface. However, the stress is absorbed and relieved through deformation of the soft metal body 206. Further, the stress that is a part of the thermal stress between the connecting board 210 and the printed circuit board 240 and is applied to the printed circuit board side, is applied to the pad 242 in the direction parallel to the main surface 240*a*. However, since the pad 242 is attached to the printed circuit board 240 relatively firmly and furthermore made of Cu so that it is easily deformable to absorb the stress, breakage is hardly caused. Accordingly, as compared with the case in which the LGA type base plate 220 and the printed circuit board 240 are connected without interposing therebetween the connecting board 210 as has heretofore been made according to the prior art, there never occurs breakage between the both and a long life or a good durability can be attained.

In the meantime, in the above described embodiment, the printed circuit board 240, the connecting board 210 and the LGA base plate 220 are placed one upon another in this order and then joined (soldered) together at one time by reflow to constitute an assembly 250 consisting of three parts. However, as described with respect to the first embodiment, a method of not making the assembly 250 at one stroke but making it through some strokes can be taken. That is, the connecting board 210 can be once attached to the LGA type base plate 220 to constitute a base plate with a connecting board (i.e., a subassembly of connecting board and base plate) and thereafter further connected to the printed circuit board 240. Further, the connecting board 210 and the printed circuit board 240 can be first connected to constitute a printed circuit board with a connecting board (i.e., a subassembly of connecting board and mounting board).

Figure 14A:
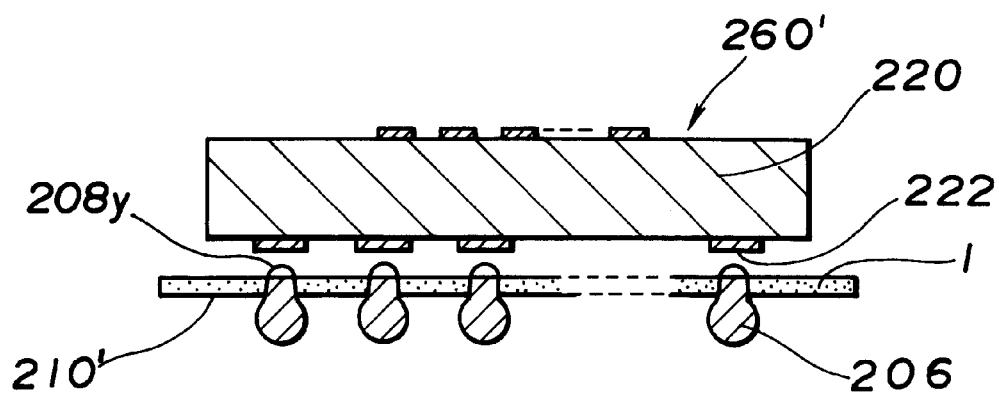

In the above described embodiment, the solder layers 208*x* and 208*y* are formed on the upper and lower surfaces of the soft metal body 206. However, if, for example, it is desired to first connect the base plate 220 and the connecting board 210 and constitute a base plate with a connecting board, it may be done, as shown in FIG. 14A, to prepare a connecting board 210' not provided with the solder layers 208*x* but with only the solder layers 208*y*, then place the connecting board 210' and the base plate 220 one upon another and connect them together for thereby constituting a base plate with a connecting board (i.e., a subassembly of base plate and connecting board). By doing so, it becomes unnecessary to apply solder paste to the pads 222 of the base plate 220 and forming ball-shaped terminals thereon, but the protruded portions 206*x* which substitute for the ball-shaped terminals, can be formed at one time, to make the base plate 220 connectable to the printed circuit board 240. Accordingly, it can be dispensed with the equipment or apparatuses necessitated for IC chip makers or manufacturers to form the BGA type base plate from the LGA type base plate, and it becomes possible to make a base plate 260' with a connecting board, which is equated to a BGA type base plate, with ease.

Figure 14B:
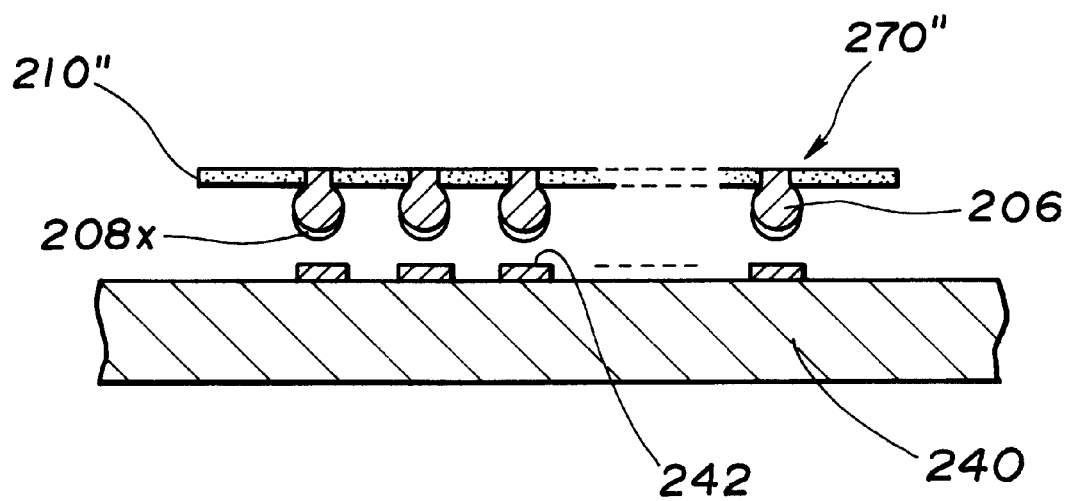

On the contrary, if it is desired to first connect the connecting board 210" and the printed circuit board 240 to constitute a printed circuit board with a connecting board (i.e., a subassembly of connecting board and mounting board), it can be done, as shown in FIG. 14B, to make a connecting board 210" not provided with the solder layers 208*y* but with only the solder layers 208*x*, place the connecting board 210" and the printed circuit board 240 one upon another and connect them together to constitute a printed circuit board with a connecting board (i.e., a subassembly of connecting board and printed circuit board). By so doing, it is unnecessary to apply paste to the pads 242 of the printed circuit board 240 but the connecting board 210" and the printed circuit board 240 can be connected at one time. Accordingly, it becomes possible for users to dispense with an equipment or installations and processes for applying solder paste to the printed circuit board 240.

In the above described embodiments, it has been described and shown that connection of the soft metal body 206 is made with its protruded portion 206*x* facing toward the printed circuit board 240 side, i.e., the protruded portion 206*x* is used as a second protruded portion for connection to the pad 242 of the mounting board 240.

However, in case the base plate and the mounting board are made of different materials, it can be done to dispose the connecting board 210 in an upside-down state as compared with that shown in FIGS. 13A and 13B and use the protruded portion 206*x* as a first protruded portion for connection to the pad of the base plate. For example, in the case the material of the base plate is aluminum nitride which is smaller in coefficient of thermal expansion than alumina and the mounting board is made of alumina ceramic which is a material substantially similar to that of the connecting board substrate, there is scarcely caused any thermal expansion difference between the connecting board substrate and the mounting board and on the other hand there is caused a thermal expansion difference between the base plate and the connecting board substrate. In such a case, it will do to make larger the distance between the base plate and the connecting board substrate so that stress can be absorbed by the protruded portions 206*x*.

Further, such an arrangement can be adopted for use in such a case a connecting board whose connecting board substrate is made of a resinous material is interposed between a base plate made of alumina or the like ceramic and a mounting board made of glass epoxy or the like resinous material.

By disposing solder layers on soft metal bodies, the connecting board can be connected to the base plate and the mounting board at one time.

(Third Embodiment)

A third embodiment in which the protruded portion of a soft metal body is not spherical or semi-spherical but in the form of pillar or post will be describe hereinafter.

In the similar manner as described with respect to the above described first embodiment and with reference to FIGS. 1A to 1C, a connecting board substrate 1 made of alumina ceramic and having metal layers 4 on the inner circumferential surfaces of through holes H. In this embodiment the same connecting board substrate 1 as that used in the first and second embodiments is used.

Figure 15A:
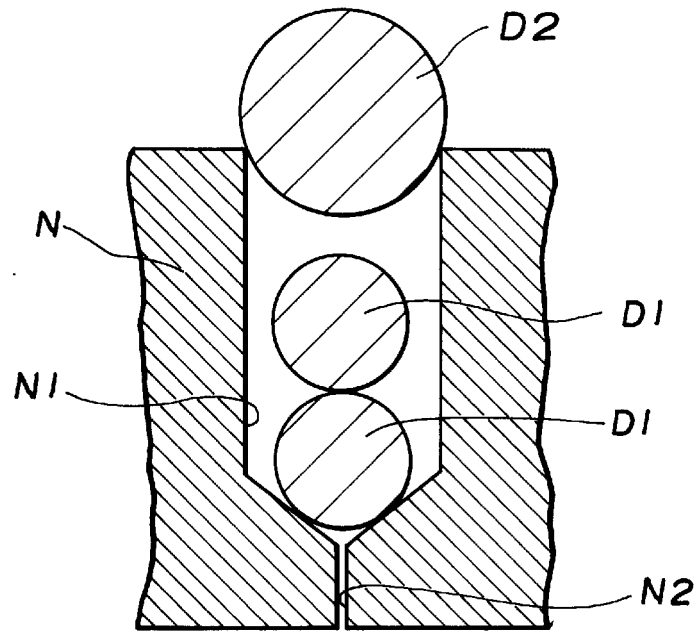

Then, soft metal bodies 306 are inserted or mounted in the through holes H. Pillar-shaped or post-shaped soft metal bodies 306 are formed by using a jig having the same structure as the receiving jig J. As shown in FIG. 15A, depressions N1 each having a conical tip, a diameter of 0.9 mm and a depth of 0.95 mm are formed at the positions corresponding to the through holes H in the upper surface of a solder piece holding jig N which is made of carbon having a good heat resistance and unwettable to the molten high temperature solder. Small air vents N2 having a diameter of 0.2 mm extend from the conical tip of the depressions N1 downward through the holding jig N.

Balls D1 having a diameter of 0.88 mm and made of high temperature solder, for example, comprising 90% Pb and 10% Sn is disposed on the free end (upper end) of each depression N1. It is convenient to use the similar ball control plate to the ball control plate S employed in the second embodiment to dispose the high temperature solder balls B on the ends of the through holes H when the balls D2 are disposed on the free ends of the depressions D1 of the holding jig N.

It is preferred that a small space be provided between the ball D2 and the upper ball D1 in each depression N1 so that they are not in contact with each other before they are melted and can contact each other after they have melted. In this arrangement, the ball D2 closely engages the upper edge of each depression N1 so as not to be moved or so as to be hardly moved with respect thereto, and the connecting board substrate 1 is easily positioned as will be described later.

Figure 15B:
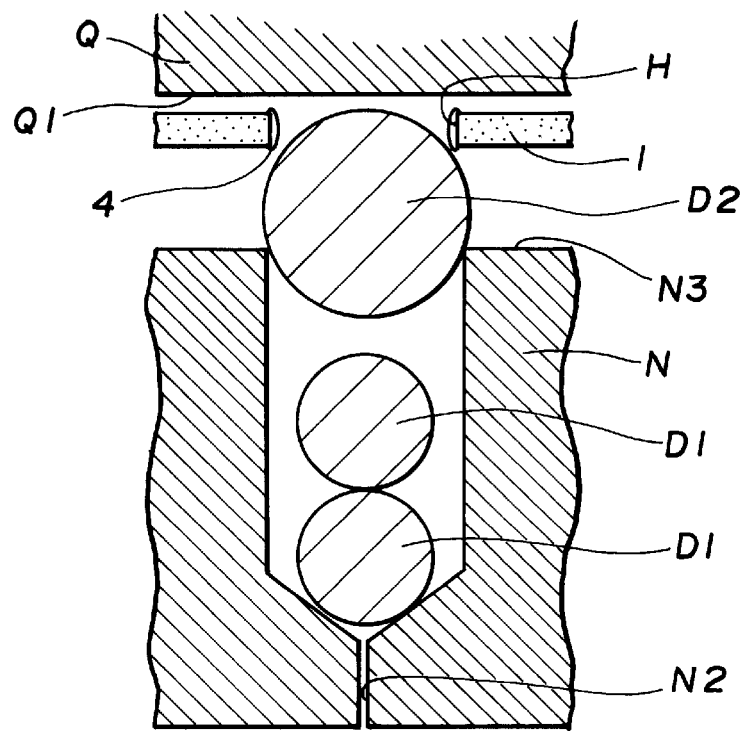

As shown in FIG. 15B, the connecting board substrate 1 is placed on the balls D2 in such a manner that the balls D2 are fitted in the through holes H.

A loading Jig Q having a good heat resistance and made of stainless steel which is unwettable to molten high temperature solder is placed on the substrate 1 in such a way that the flat surface (the lower surface in the figure) Q1 of the jig Q contacts the upper surface of the substrate 1 and presses the balls D2 downward.

The jig N and Q and the substrate 1 disposed between both jigs N and Q are put in a reflow furnace and heated at the maximum temperature of 360° C. for the maximum temperature holding time of one minute in a nitrogen atmosphere to melt the high temperature solder balls D1 and D2. The molten high temperature solder is lowered to be inserted into the through holes H of the substrate 1 which is pressed downward by means of the loading jig Q and welded onto the metal layers 4 on the inner peripheral surfaces of the through holes H. The upper portion of the solder D2 is made flat after the shape of the flat surface Q1 of the loading jig Q at the upper end of each through holes H. The high temperature solder D2 is further inserted into the depressions N1 of the holding jig N and contact the molten solder D1 and the molten solder D1 and the molten solder D2 tend to become one piece under the surface tension. However, since the solder D2 is welded onto the metal layers 4 and is made integral with the substrate 1, the solder D2 cannot be separated from the substrate 1 to fall on the bottom of the depressions. Thus, the solder D1 is raised against the gravity to become integral with the solder D1. The substrate 1 is lowered by the loading jig Q until the upper surface of the substrate 1 pressingly contacts the upper surface N3 of the holding jig N.

The air vents N2 prevent air from being confined in the depressions N1 and allow the air to be relieved therefrom.

Figure 16:
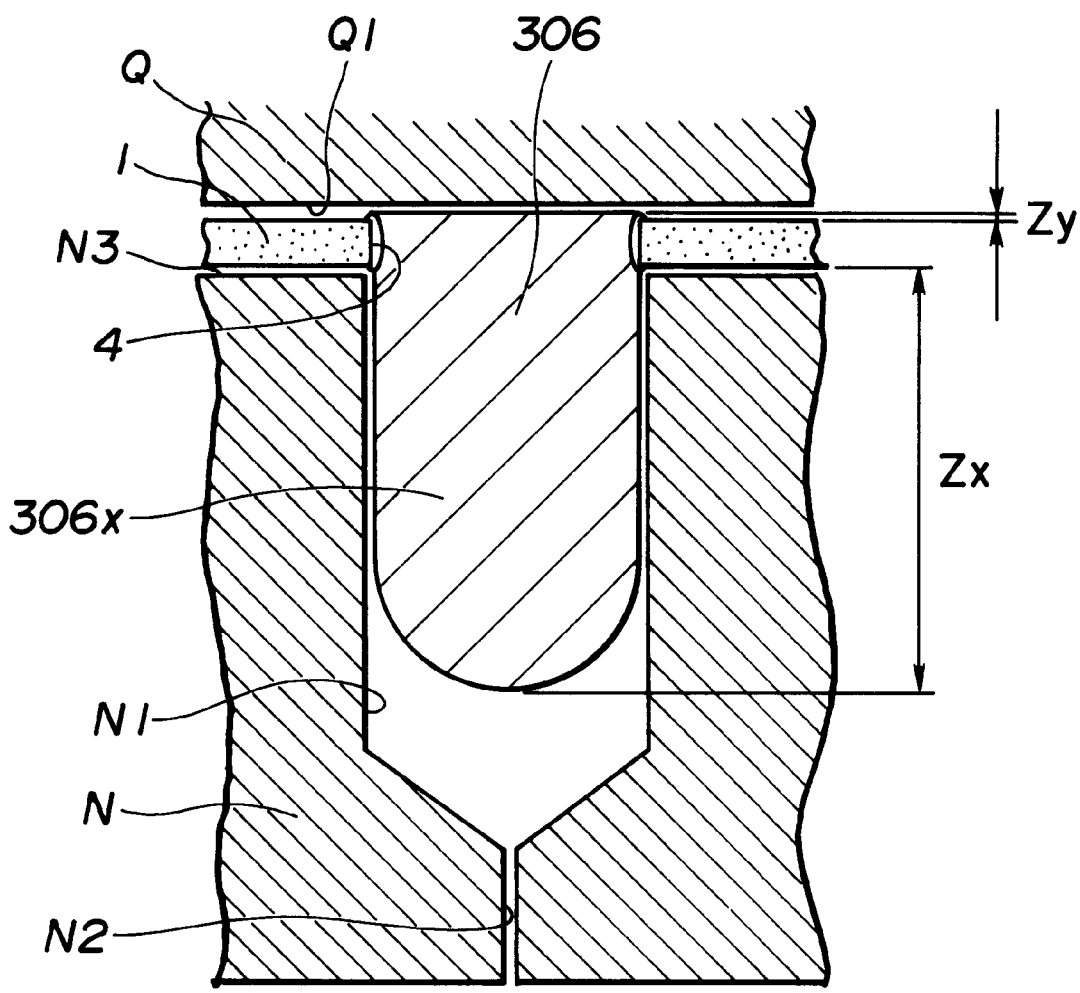
FIG. 16 is an enlarged fragmentary sectional view for illustrating a state in which soft metal is poured into a connecting board substrate so as to penetrate therethrough and formed into a pillar-shaped or post-like protrusion.

The high temperature solder is cooled to be solidified. Under the substrate 1 there is formed a connecting board substrate in which soft metal bodies 306 having downward protruded portions 306x each having a nearly semi-spherical lower end by the effect of the surface tension but having no upward protruded portions or very low upward protruded portions, are inserted or mounted as shown in FIG. 16. In an example of this embodiment, the protruded portion 306x has a nearly cylindrical pillar or post shape and its height Zx from the lower surface of the connecting board substrate 1 to tip thereof is larger than the diameter. On the other hand, the height Zy of the protruded portion from the upper surface of the substrate 1 is 0.01 mm.

Figure 17A:
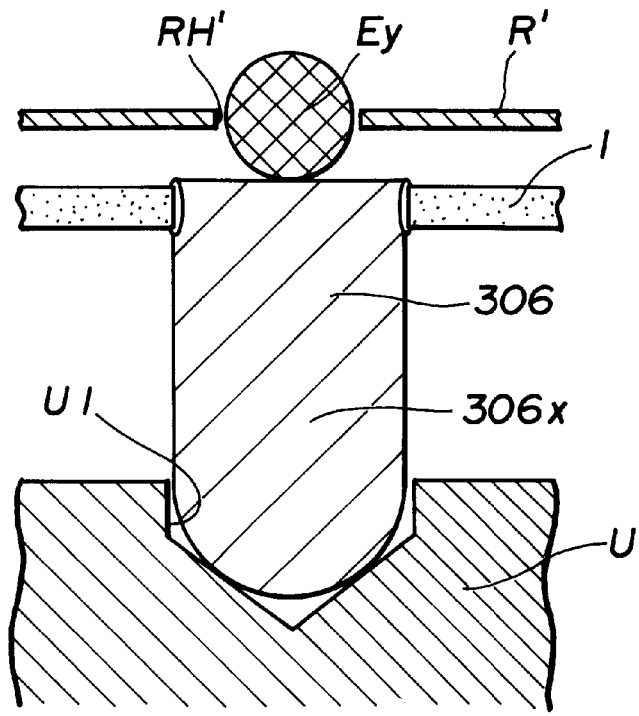

As shown in FIG. 17A, low temperature solder balls Ey made of Pb—Sn eutectic solder and having a diameter of 0.4 mm are placed on the upper surface of the soft metal bodies 306. This can be done easily by setting ball control plate R' with the through holes RH' aligned with the soft metal bodies, placing the balls Ey at random on the ball control plate R', swinging the ball control plate R' and causing the balls Ey to fall in the through holes RH'. The ball control plate R' has a thickness of 0.5 mm and the through holes RH' has a diameter of 0.6 mm.

It is convenient to place the solder balls on the soft metal bodies in a state in which the protruded portions 306x are being inserted in the depressions N1 of the holding jig N, i.e., in the state in which only the loading jig Q is removed as shown in FIG. 16, or in a state in which the tip ends of the protruded portions 306x are inserted in the depressions U1 of a soft metal holding Jig U as shown in FIG. 17A. It is because the soft metal bodies 306 are made of soft and deformable high temperature solder.

Thereafter, reflow is conducted in a reflow furnace of the maximum temperature of 220° C. and of the maximum temperature holding time of one minute in a nitrogen atmosphere thereby to melt the low temperature solder balls Ey. The soft metal bodies 306 are not melted under this temperature condition. The molten low temperature solder wettably spreads over the upper surface of the soft metal bodies 306 to form solder layers 308y (see FIG. 17B).

Since the volume of the low temperature solder ball Ey is constant, the solder layer 308y has a constant volume and thus it has a constant height. In this embodiment, the height of the solder layer 308y from the upper surface of the connecting board substrate 1 to the top of the solder layer 308y is 0.08 mm.

Figure 17B:
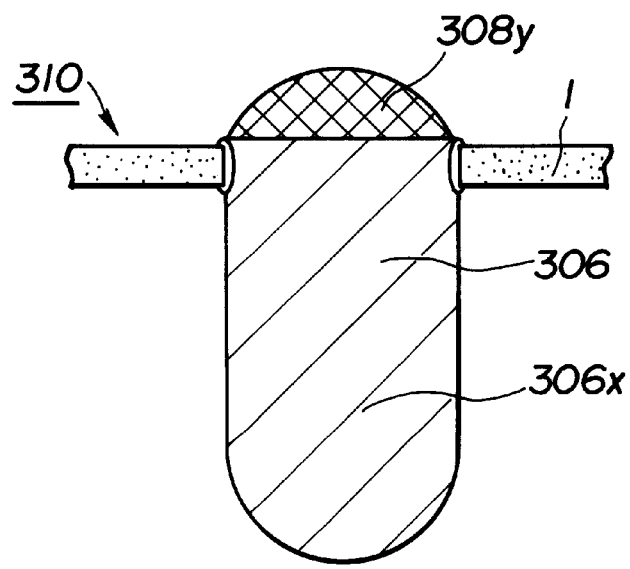

In this manner, as shown in FIG. 17B, there can be produced a connecting board 310 including a connecting board substrate 1 having through holes H extending therethrough between the upper and lower surfaces thereof, a plurality of soft metal bodies 306 inserted or mounted in the respective through holes H and each having a protruded portion 306x protruding from the lower surface of the substrate 1 (when observed in the figure), and solder layers 308y formed on the respective soft metal bodies on the upper surface side of the substrate 1 (when observed in the figure).

In this embodiment, the solder layers 308y are formed only on the upper ends of the soft metal bodies 306. However, a connecting board 310 having solder layers 308y formed on both upper and lower end portions can be produced by the method as described with respect to the first and second embodiments (see FIG. 18A). Alternately, there can be further produced or manufactured a connecting board having solder layers 308x only on the lower end portions, i.e., on the tips of the protruded portions 306x (see FIG. 18B).

Figure 18A:
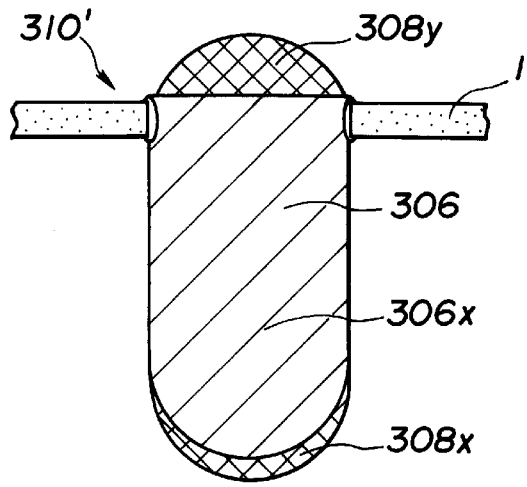
FIGS. 18A and 18B are enlarged fragmentary sectional views for illustrating the states in which a solder layer is formed on both the upper and lower surface sides (FIG. 18A) and only on the lower surface side (18B) of the soft solder body.
Figure 18B:
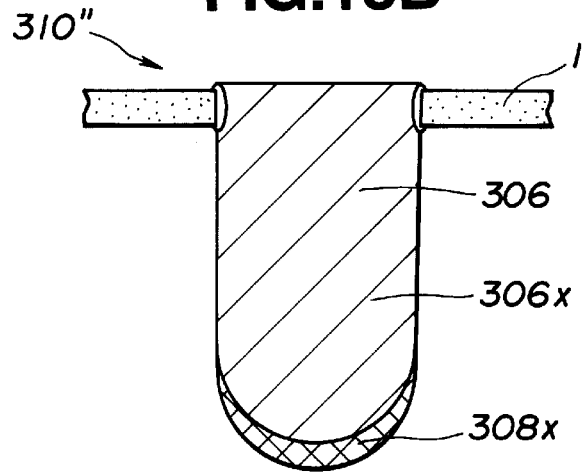
Figure 19:
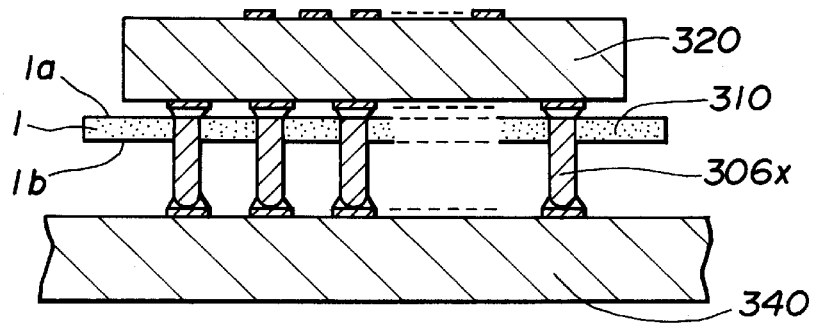
FIG. 19 is a sectional view for illustrating a state in which a connecting board having pillar-shaped soft metal bodies is connected to a base plate and a mounting board.

In the meantime, in case of forming the solder layers 308x and 308y as shown in FIG. 18A, it is desirable that the volume of the solder layer 308x to be provided on the larger protruding height Z side, i.e., on the protruded portion 306x side is made smaller than that of the other solder layer 308y. This is because at the protruded portion 306x of a larger protruding height the low melting point solder spreads over the side or circumferential surface and is liable to become thinner and it is desirable to increase the amount of solder so as to prevent the amount of solder that contributes to connection with the pads 322 and 342 of the base plate and the printed circuit board which will be described hereinafter, from becoming too small, i.e., smaller than the necessity. On the other hand, at the protruded portion 306y of a smaller protruding height there is not any extra side or peripheral surface over which the low melting point solder spreads and the solder-layer 308y is liable to become thick, so it is desirable to decrease the amount of solder so as to prevent the amount of solder from becoming too much at the time of connection with the pads 322 and 342.

In this connection, similarly to the second embodiment, in case a LGA type base plate 320 and a printed circuit board 340 are connected to each other by interposing therebetween a connecting board 310 in such a manner that the protruded portions 306x are located between the connecting board substrate 1 and the printed circuit board 340, it was observed that the distance between the base plate 320 and the connecting board 310 (i.e., the distance between the base plate 320 and the first surface 1a of the connecting board substrate 1) is 0.03 mm and the distance between the connecting board 310 and the printed circuit board 340 (i.e., the distance between the second surface 1b of the connecting board substrate 1 and the printed circuit board 340) is 1.78 mm.

That is, in case of such a columnar protruded portion (306x in this embodiment) as shown in this embodiment, it becomes possible to make larger the distance between the base and the connecting board substrate or the distance between the connecting board substrate and the mounting board as compared with a semi-spherical protruded portion. Accordingly, it becomes possible to relieve much more the stress caused between the both. As compared with a semi-spherical protrusion, a pillar-shaped or post-like protruded portion of the same height can be thinner and is thus deformable easier. Further, in case the both are the same in the maximum diameter, the columnar one is larger in height and therefore deformable easily.

Further, since the distance between the adjacent soft metal bodies is usually set to a predetermined value, the maximum diameter of the protruded portion is restricted by that distance. On the other hand, it is considered that an allowable range with respect to the height of the protruded portion is large in many cases.

Accordingly, when the protruded portion is shaped like post or pillar, its protrusion height can be made larger up to an allowable limit, with its maximum diameter being held under the limit, so it becomes possible to make larger the distance between the base plate and the mounting board and furthermore make thinner the protruded portion so that much more stress can be relieved.

Moreover, since the protruded portion is formed from a soft metal body, it can relieve stress through plastic deformation of itself.

Accordingly, it becomes possible to improve the reliability in the connection between the connecting board and mounting board and make longer the life of the joint therebetween.

While the present invention has been described and shown with respect to the above described first, second and third embodiments, it is not limited to those embodiments but various modifications and variations can be made thereto without departing from the invention.

While in the above described embodiment it has been described to use alumina ceramic as the material of the connecting board substrate 1, this is not for the purpose of limitation but aluminum nitride, silicon nitride, silicon carbide, mullite or other ceramic can be used. Particularly, since the connecting board substrate 1 is subjected to relatively large stress, it is desirable to select according to the circumstances, as a material for the substrate 1, one that is high in the rupture strength and the toughness. Further, depending upon the materials of the base plate and mounting board, glass epoxy, glass BT resin, epoxy resin, BT resin or the like resinous material can be used, and it is particularly desirable to use such a resinous material in case a base plate made of a resinous material is used for the base plate since they approximate in the coefficient of thermal expansion to each other.

The base plate is also not limited to the above described one that is made of alumina ceramic but aluminum nitride, silicon nitride, mullite, glass ceramic or the like ceramic material can be used for the base plate through selection according to the circumstances. Further, a base plate made of glass epoxy, BT resin or the like resinous material can be used. Further, the base plate is not limited to such one that has disposed thereon an IC chip. That is, the base plate can be such one that has disposed thereon a transistor or the like active element, resistor, capacitor or the like electronic device, other than an IC chip.

Further, while in the above described embodiments the mounting board has been described and shown as being such one that is made of glass epoxy, this is not for the purpose of limitation. That is, it can be a board made of BT resin or phenol resin, such as glass BT resin or paper phenol resin, or a board made of alumina or the like ceramic. Further, while the mounting board has been described and shown as a motherboard, it can be such one that is adapted to attach thereto a single base plate or such one that is adapted to attach thereto a plurality of base plates.

Further, while in the above described embodiment it has been described to use carbon (graphite), stainless steel or the like for forming a jig that has a property of rejecting or repelling molten soft metal and molten solder, any material will do so long as it is not wettable to molten metal used, i.e., boron nitride, silicon nitride, alumina or the like ceramic, or stainless steel, titanium or the like metal can be used other than carbon.

Particularly, since the above described transfer plate, solder piece holding jig and ball control plate are in the form of plate, stainless steel or the like metal can be conveniently or successfully used for the reason of the fact that it is hardly to cause breakage or the like damage. On the other hand, for the purpose of making smaller the coefficient of thermal expansion and preventing warp or the like due to heat, ceramic can be used conveniently and successfully.

In the meantime, while in the above described first embodiment a transfer plate formed with a plurality of through holes is used by way of example, one that is formed with a plurality of recesses can be used otherwise. When such is the case, it becomes possible to make all the solder layers of the uniform height, so when the connecting board is placed for lamination with the base plate and the mounting board, it becomes possible to bring the solder layers and the pads into contact with each other or make them sufficiently close to each other, and therefore it becomes possible to connect the pads and the solder layers assuredly. Further, if the top of the solder layers are flat or planar, movement of the connecting board when the connecting board is placed for lamination with the base plate, etc. is hard to occur, so that connection can be attained more easily. In the meantime, the solder layers can be formed with flat tops, after the solder layers on the first surface side and the second surface side are formed, by being compressed between parallel plates or so compressed while being heated to melt.

What is claimed is:

1. A method of making a connecting board to be disposed between a base plate having a plurality of surface-bonding pads and a mounting board having a plurality of surface-bonding and mounting pads at corresponding positions to the surface-bonding and mounting pads of the base plate, for connection of the base plate and the mounting board through connection at the surface-bonding pads on a first surface side of the connecting board and at the surface-bonding and mounting pads on a second surface side of the connecting board, the connecting board including a substrate in the form of a flat plate, having the first surface side and the second surface side and a plurality of through holes extending between the first and second surface sides, a plurality of soft metal bodies mounted in the through holes, respectively, each of the soft metal bodies having at least one of a first protruded portion protruding from the first surface side and a second protruded portion protruding from the second surface side, a plurality of first surface side solder layers, each of which is disposed on a surface portion of each of the soft metal bodies, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, the method comprising the steps of:

metallizing an inner circumferential wall of each of said through holes of said connecting board substrate;

preparing a plurality of solder balls for forming said respective soft metal bodies, said solder balls being larger in diameter than said through holes;

mounting said solder balls on said connecting board substrate in such a manner that each of said solder balls partly gets into each of said through holes and is thereby held in place;

heating and melting said solder balls and allowing said solder balls to be embedded in said through holes and partly protrude downward from said through holes; and cooling and solidifying said solder balls.

2. A method according to claim 1, further comprising the steps of:

preparing a jig made of an unwettable material to molten soft metal and having depressions at corresponding positions to said through holes; and disposing said jig under said connecting board substrate for receiving at said depressions the solder balls melted to protrude downward from the through holes.

3. A method according to claim 1, further comprising the steps of:

preparing a jig made of an unwettable material to molten soft metal and having a planar surface; and prior to said heating and melting, mounting said connecting board substrate on said planar surface of said jig.

4. A method of making a connecting board to be disposed between a base plate having a plurality of surface-bonding pads and a mounting board having a plurality of surface-bonding and mounting pads at corresponding positions to the surface-bonding pads of the base plate, for connection of the base plate and the mounting board through connection at the surface-bonding pads on a first surface side of the connecting board and at the surface-bonding and mounting pads on a second surface side of the connecting board, the connecting board including a substrate in the form of a flat plate, having the first surface side and the second surface side and a plurality of through holes extending between the first and second surface sides, a plurality of soft metal bodies mounted in the through holes, respectively, each of the soft metal bodies having at least one of a first protruded portion protruding from the first surface side and a second protruded portion protruding from the second surface side, a plurality of first surface side solder layers, each of which is disposed on a surface portion of each of the soft metal bodies, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, respectively, the soft metal bodies are made of one of the solders having a higher melting point, and the first and second solder layers are made of the other of the solders having a lower melting point, the method comprising the steps of:

preparing a transfer plate having paste filling holes at corresponding positions to the soft metal bodies;

filling solder paste having a melting point lower than said soft metal bodies into said paste filling holes;

disposing said transfer plate on at least one of said first surface side and said second surface side of said connecting board while aligning said paste filling holes with the soft metal bodies; and heating and melting said solder paste at a temperature lower than the melting point of the soft metal bodies and forming at least one of said first surface side solder layer and said second surface side solder layer.

5. A method of making an assembly consisting of a base plate, a connecting board and a mounting board, the base plate having a plurality of surface-bonding pads, the mounting board having a plurality of surface-bonding and mounting pads at corresponding position to the surface-bonding pads of the base plate, the connecting board being disposed between the base plate and the mounting board to form an electrical connection between the surface bonding pads of the base plate and the surface-bonding and mounting pads of the mounting board, the connecting board including a substrate in the form of a flat plate, having a first surface side and a second surface side and a plurality of through holes extending between the first and second surface sides, a plurality of soft metal bodies mounted in the through holes, respectively, each of the soft metal bodies having at least one of a first protruded portion protruding from the first surface side and a second protruded portion protruding from the second surface side, a plurality of first surface side solder layers, each of which is disposed on a surface portion of each of the soft metal bodies, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, the method comprising the steps of:

disposing said connecting board between said base plate and said mounting board in such a manner that the soft metal bodies are aligned with said surface-bonding pads at said first surface side and with said surface-bonding and mounting pads at said second surface side, respectively;

heating said base plate, said connecting board and said mounting board at a temperature lower than a melting point of the soft metal bodies to melt said first surface side solder layers and said second surface side solder layers; and cooling said first side solder layers and said second surface side solder layers to form an electrical connection between said surface-bonding pads and said surface-bonding and mounting pads by way of the soft metal bodies.

6. A method of making a subassembly of a base plate and a connecting board, the base plate having a plurality of surface-bonding pads, the connecting board including a substrate in the form of a flat plate, having a first surface side and a second surface side and a plurality of through holes extending between the first and second surface sides, a plurality of soft metal bodies mounted in the through holes, respectively, each of the soft metal bodies having at least one of a first protruded portion protruding from the first surface side, and a second protruded portion protruding from the second surface side, a plurality of first surface side solder layers, each of which is disposed on a surface portion of each of the soft metal bodies, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, the method comprising the steps of:

mounting said base plate on said first surface side of said connecting board in such a manner that the soft metal bodies are aligned with said surface-bonding pads, respectively; and heating said base plate and said connecting board at a temperature lower than a melting point of the soft metal bodies to melt said first surface side solder layers; and cooling said first surface side solder layers to form an electrical connection between said soft metal bodies and said surface-bonding pads.

7. A method of making a subassembly of a connecting board and a mounting board, the mounting board having a plurality of surface-bonding and mounting pads, the connecting board including a substrate in the form of a flat plate, having a first surface side and a second surface side and a plurality of through holes extending between the first and second surface sides, a plurality of soft metal bodies mounted in the through holes, respectively, each of the soft metal bodies having at least one of a first protruded portion protruding from the first surface side and second protruded portion protruding from the second surface side, a plurality of first surface side solder layers, each of which is disposed on a surface portion of each of the soft metals, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, the method comprising the steps of:

mounting said connecting board on said second surface side of said mounting board in such a manner that the soft metal bodies are aligned with said surface-bonding and mounting pads, respectively;

heating said connecting board and said mounting board at a temperature lower than a melting point of the soft metal bodies to melt said second surface side solder layers; and cooling said second surface side solder layers to form an electrical connection between the soft metal bodies and said surface-bonding and mounting pads.

8. A method of making a connecting board to be disposed between a base plate having a plurality of surface-bonding pads and a mounting board having a plurality of surface-bonding and mounting pads at corresponding positions to the surface-bonding pads, for connection of the base plate and the mounting board through connection at the surface-bonding pads on a first surface side of the connecting board and the surface-bonding and mounting pads on a second surface side of the connecting board, the connecting board including a ceramic substrate in the form of a flat plate, having the first surface side and the second surface side and a plurality of through holes extending between the first and second surface sides, a plurality of soft metal bodies mounted in the through holes, respectively, each of the soft metal bodies having at least one of a first protruded portion protruding from the first surface side and a second protruded portion protruding from the second surface side, a plurality of first surface side solder layers, each of which is disposed on a surface portion of each of the soft metal bodies, which is located on the first surface side, and a plurality of second surface side solder layers, each of which is disposed on a surface portion of each of the soft metal bodies, which is located on the second surface side, wherein the soft metal bodies and the first and second solder layers are made of solders of the same kind but different in melting points, the method comprising the steps of:

metallizing an inner circumferential wall of each of the through holes of said connecting board substrate;

preparing a holding jig made of unwettable material to said molten soft metal and having depressions of a circular cross section at corresponding positions to the through holes;

preparing a plurality of first soft metal balls and a second soft metal balls, said first soft metal balls being larger in diameter than said second soft metal balls and said depressions, said second soft metal balls being smaller in diameter than said depressions, said first soft metal balls and said second soft metal balls are so sized that one of said first soft metal balls and at least one of said second soft metal balls are joined to constitute one of the soft metal bodies;

disposing at least one of said second soft metal balls within each of said depressions of said holding jig;

after said disposing of said second soft metal balls, mounting said first soft metal balls on said holding jig in such a manner that each of said first soft metal balls partly gets into each of said depressions and is thereby held in place;

after said mounting of said first soft metal balls, mounting said connecting board substrate on said first soft metal balls in such a manner that each of said first soft metal balls partly gets into each of said through holes of said connecting board substrate;

heating and melting said first and second soft metal balls and allowing each of said first soft metal balls to be embedded in each of the through holes of said connecting board substrate while allowing each of said second soft metal balls to be joined with each of said first soft metal balls; and cooling and solidifying said first and second soft metal balls.

9. The method according to claim 1, further comprising the steps of:

preparing a loading jig made of an unwettable metal to molten soft metal and having a flat surface;

prior to said heating and melting, mounting said loading jig on said connecting board substrate in such a manner that said flat surface faces downward; and allowing said loading jig to press said connecting board substrate and said first soft metal balls toward said holding jig at the time of said heating and melting.

10. The method according to claim 8, wherein said metallizing comprises the steps of:

applying metallic paste to an inner peripheral surface of each of the through holes and sintering said metallic paste to form a base metal layer on the inner peripheral surface of each of the through holes; and forming a plated layer on said base metal layer.

\* \* \* \* \*